(12) United States Patent
Nitta et al.

(10) Patent No.: US 7,122,446 B2
(45) Date of Patent: Oct. 17, 2006

(54) SEMICONDUCTOR LIGHT-EMITTING ELEMENT

(75) Inventors: Koichi Nitta, Yokohama (JP);
Haruhiko Okazaki, Yokohama (JP);
Yukio Watanabe, Yokohama (JP);
Chisato Furukawa, Atsugi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 190 days.

(21) Appl. No.: 10/896,222

(22) Filed: Jul. 20, 2004

(65) Prior Publication Data
US 2005/0035362 A1    Feb. 17, 2005

Related U.S. Application Data

(62) Division of application No. 09/603,118, filed on Jun. 22, 2000, now Pat. No. 6,803,603.

(30) Foreign Application Priority Data
Jun. 23, 1999  (JP) .............................. 1999-176795
Jun. 15, 2000  (JP) .............................. 2000-179591

(51) Int. Cl.
*H01L 21/30* (2006.01)

(52) U.S. Cl. .......................... 438/458; 438/22; 438/24; 438/46; 438/47; 438/479

(58) Field of Classification Search .................... None
See application file for complete search history.

(56) References Cited

U.S. PATENT DOCUMENTS

| 5,138,625 | A |   | 8/1992  | Paoli et al. |
| 5,225,692 | A |   | 7/1993  | Takeuchi et al. |
| 5,253,264 | A |   | 10/1993 | Suzuki et al. |
| 5,351,255 | A |   | 9/1994  | Schetzina |
| 5,360,762 | A |   | 11/1994 | Takahashi et al. |
| 5,502,316 | A | * | 3/1996  | Kish et al. ..................... 257/94 |
| 5,696,389 | A | * | 12/1997 | Ishikawa et al. .............. 257/99 |
| 5,701,321 | A |   | 12/1997 | Hayafuji et al. |
| 5,977,612 | A |   | 11/1999 | Bour et al. |
| 5,990,500 | A |   | 11/1999 | Okazaki |
| 6,139,304 | A | * | 10/2000 | Centofante .................. 425/121 |
| 6,169,294 | B1|   | 1/2001  | Biing-Jye et al. |
| 6,268,230 | B1|   | 7/2001  | Kuniyasu |
| 6,326,638 | B1|   | 12/2001 | Kamiyama et al. |

FOREIGN PATENT DOCUMENTS

| JP | 7-226535   | 8/1995 |
| JP | 11-214744  | 8/1999 |
| JP | 11-251631  | 9/1999 |

* cited by examiner

*Primary Examiner*—Wai-Sing Louie
(74) *Attorney, Agent, or Firm*—DLA Piper US LLP

(57) ABSTRACT

Part of light emitted downward by an active layer is reflected by an electrode functioning as a reflective layer, and travels upward to radiate outside. Since the electrode is made of a metal, it reflects almost all light regardless of its incident angle, and light can be efficiently extracted.

4 Claims, 20 Drawing Sheets

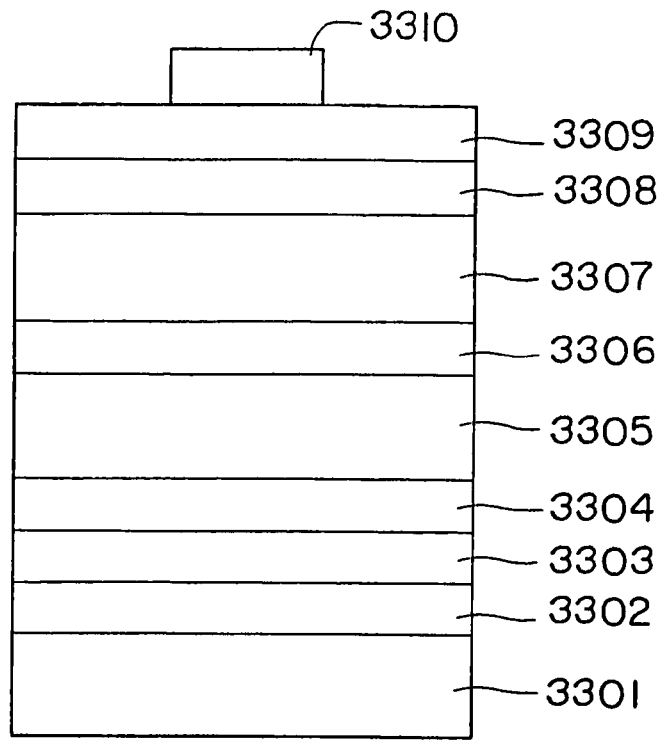
F I G. 2
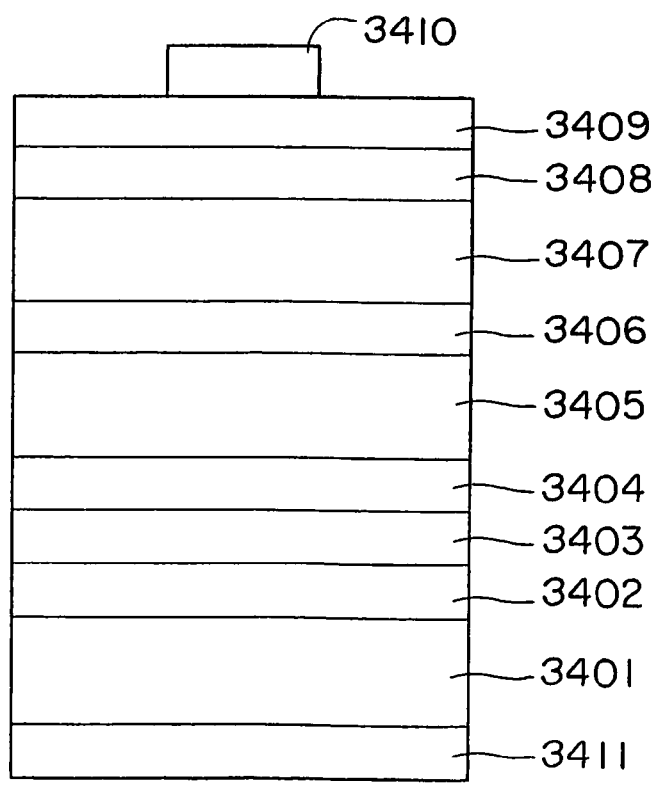
F I G. 3

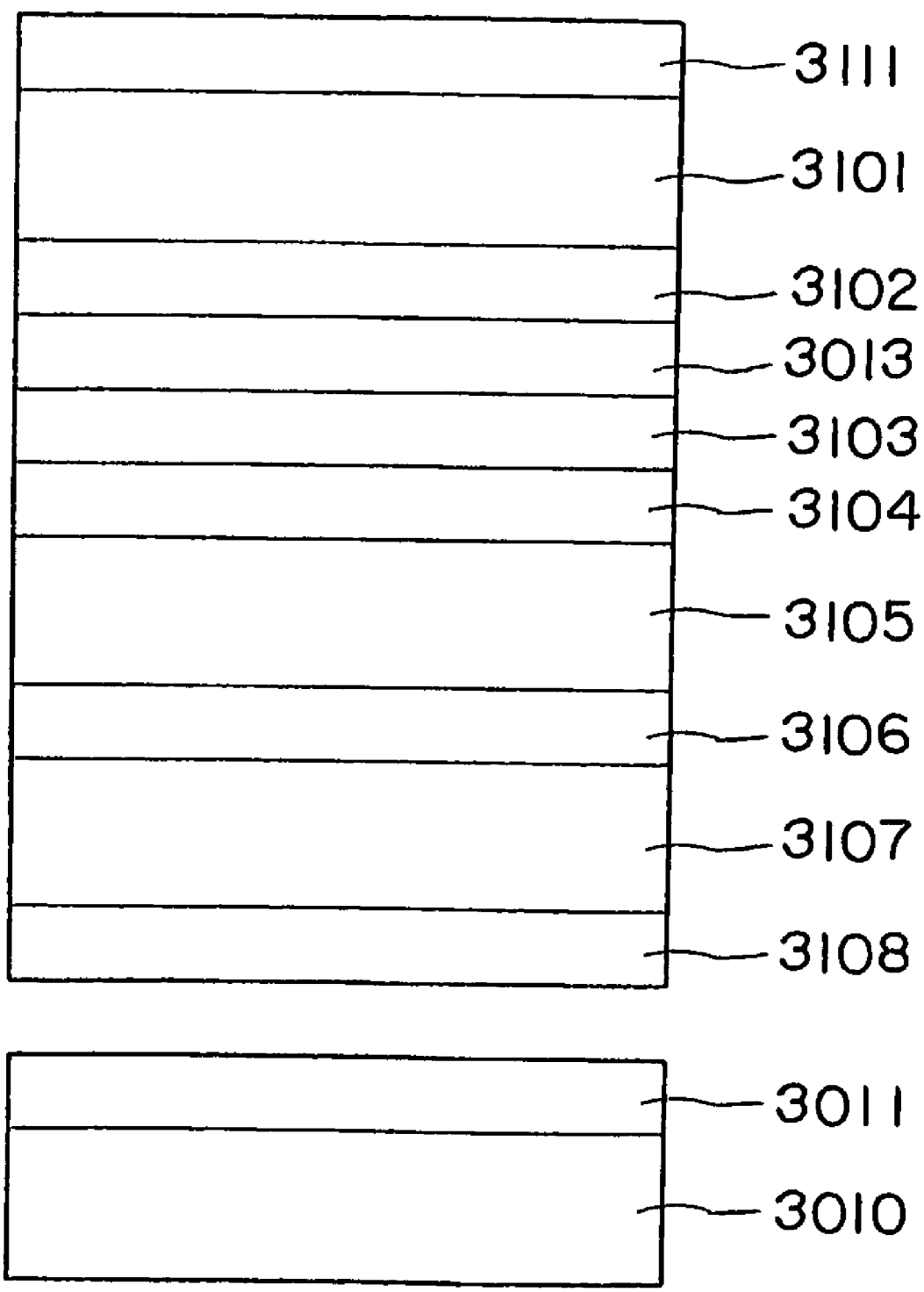
F I G. 6

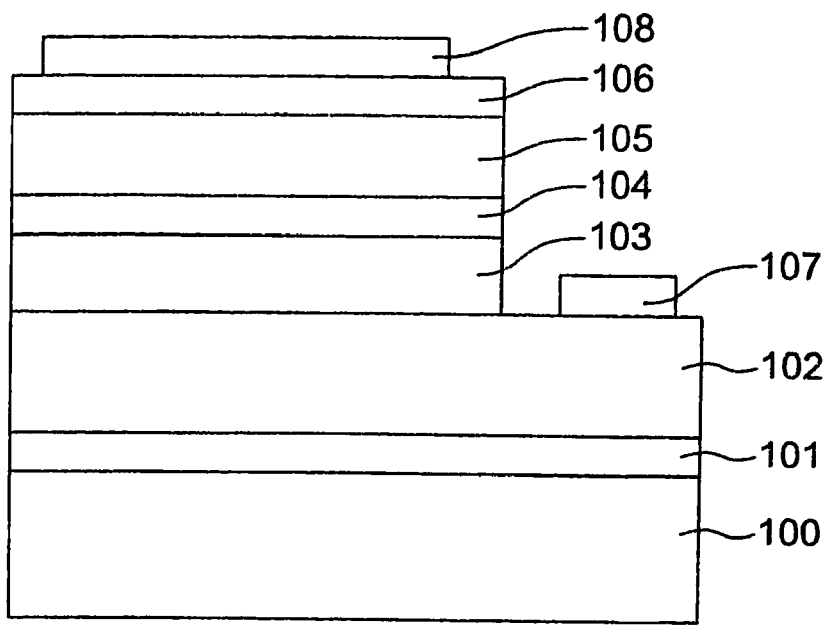
F I G. 11
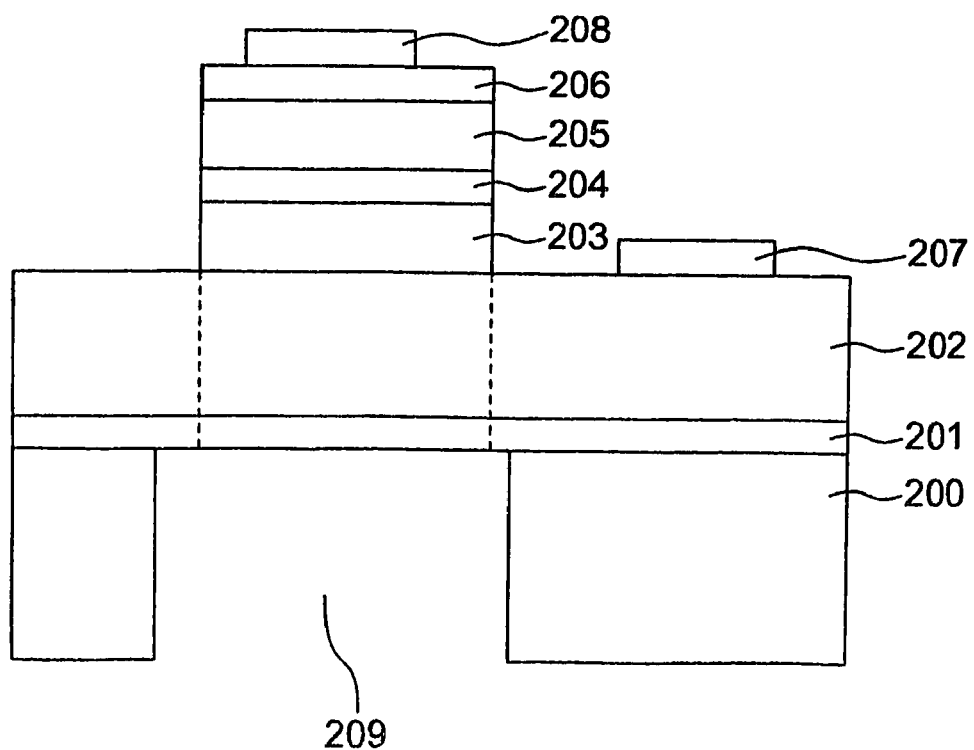
F I G. 12

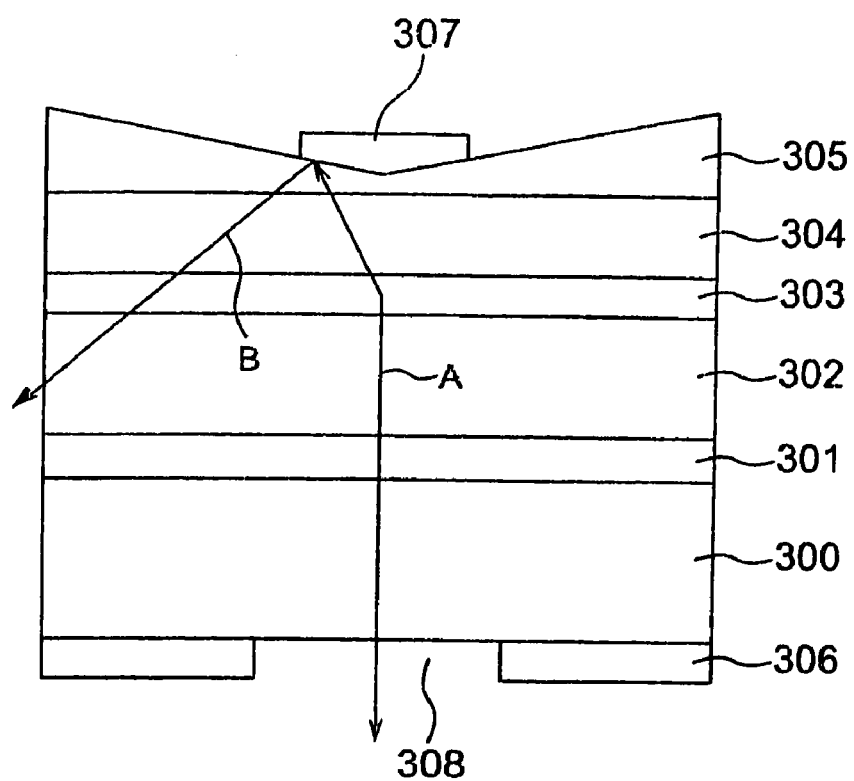
F I G. 13
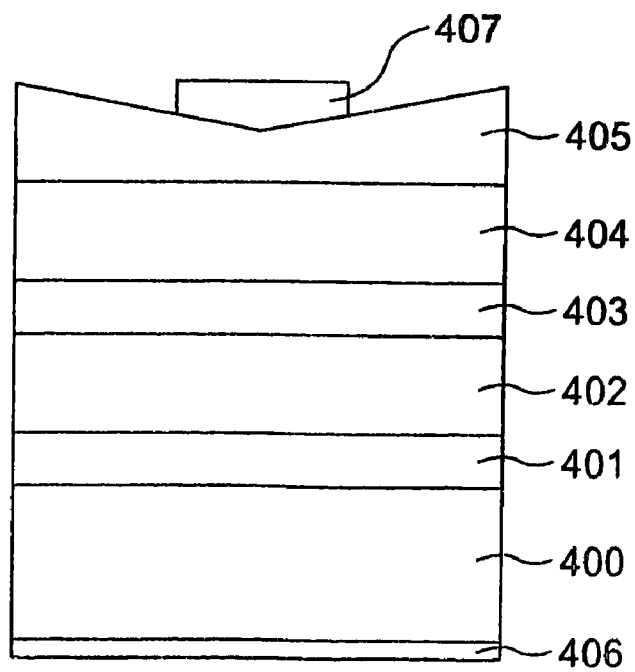
F I G. 14

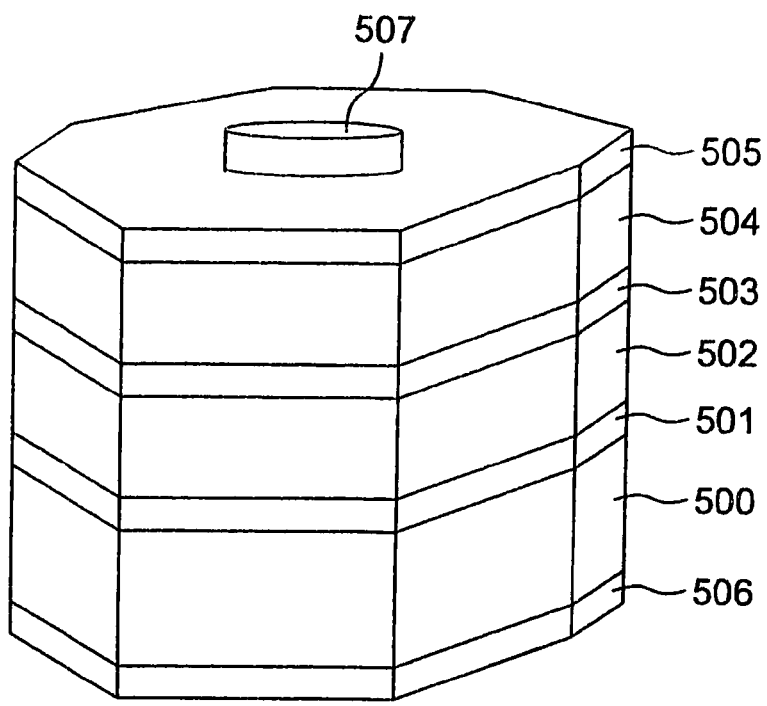
F I G. 15
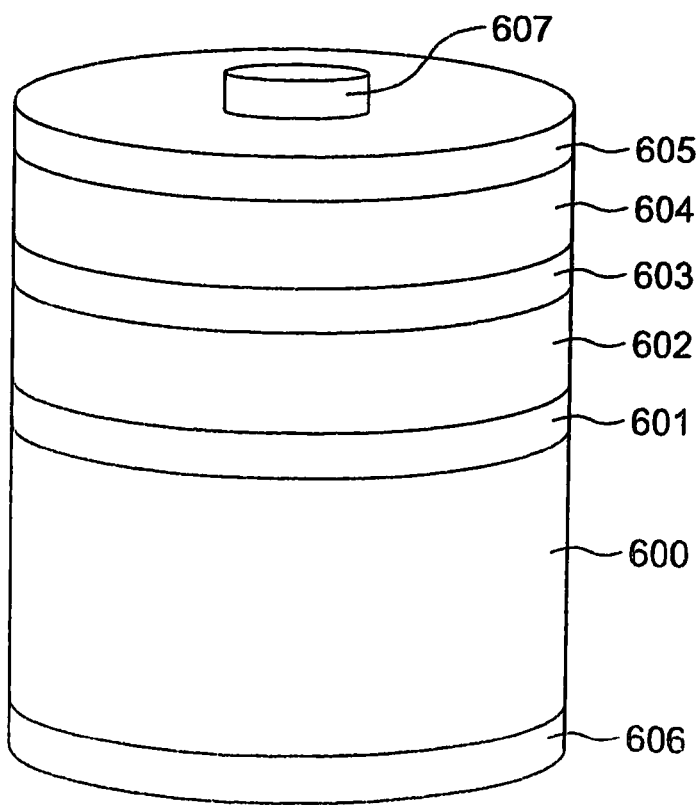
F I G. 16

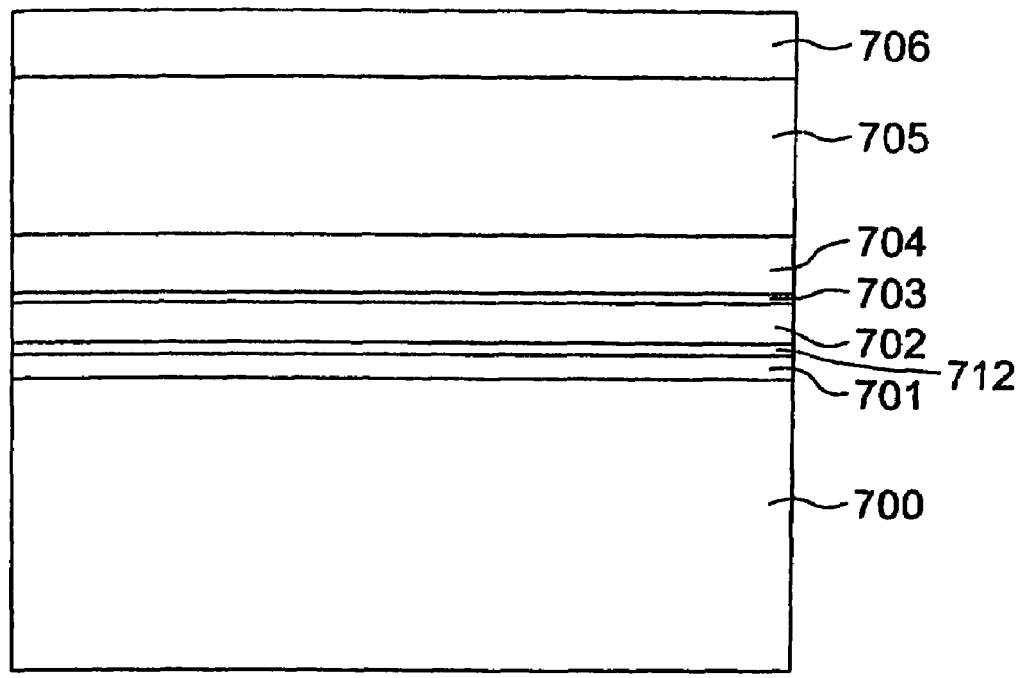
F I G. 17 A
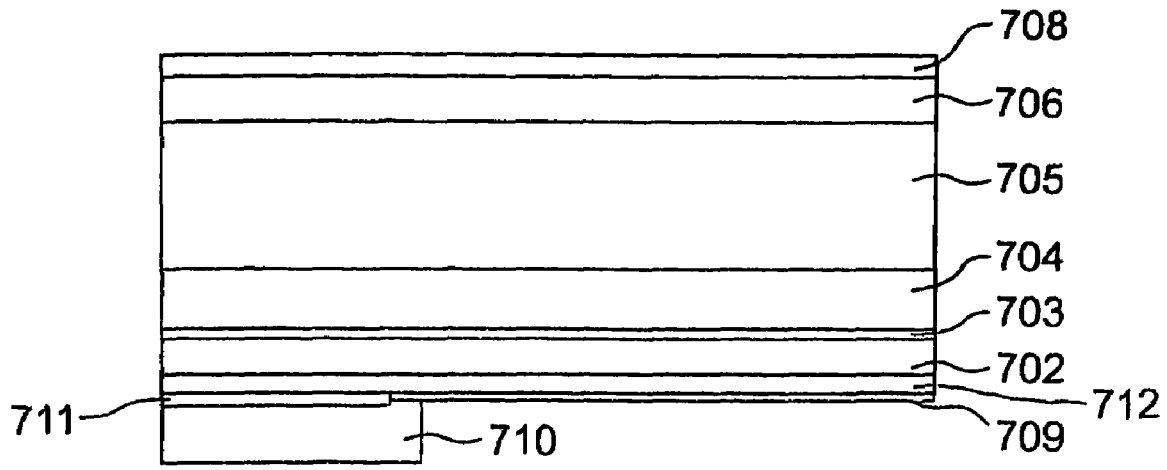
F I G. 17 B

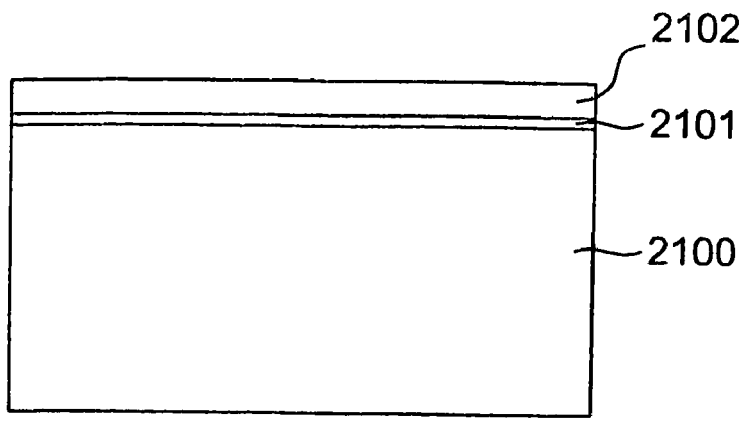
F I G. 21A
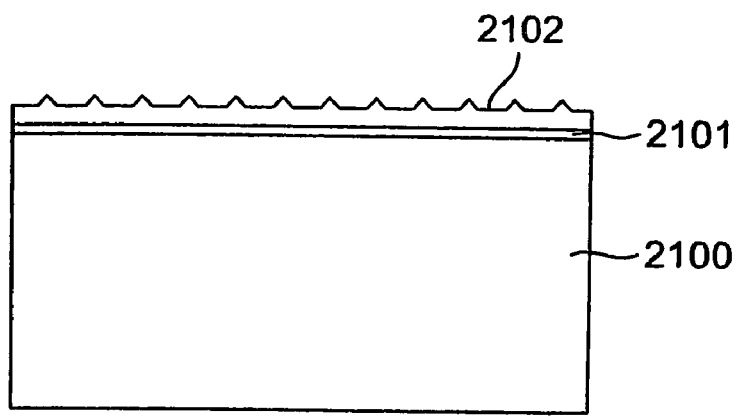
F I G. 21B
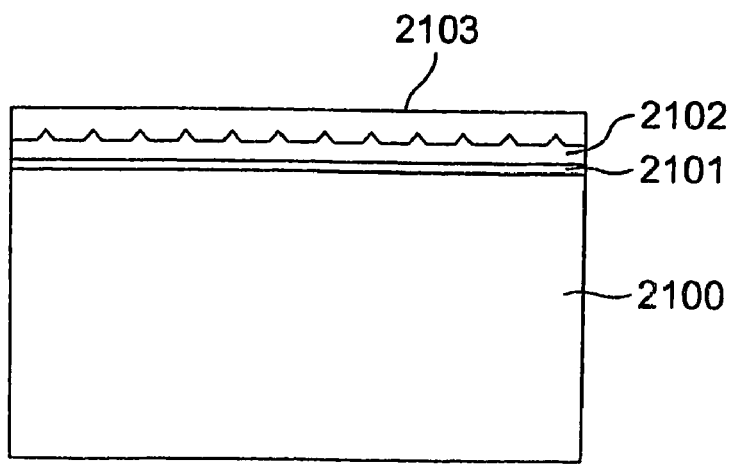
F I G. 21C

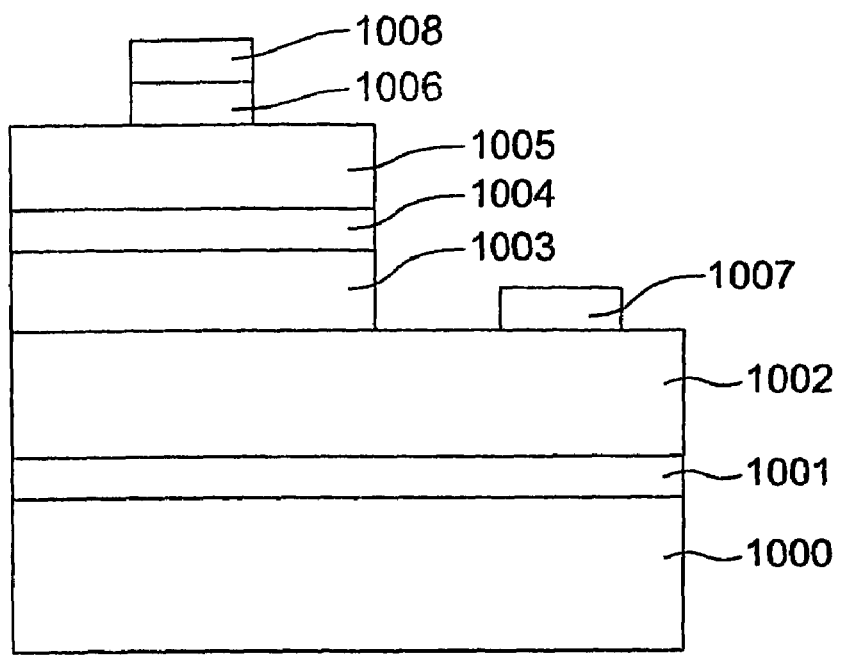
F I G. 26
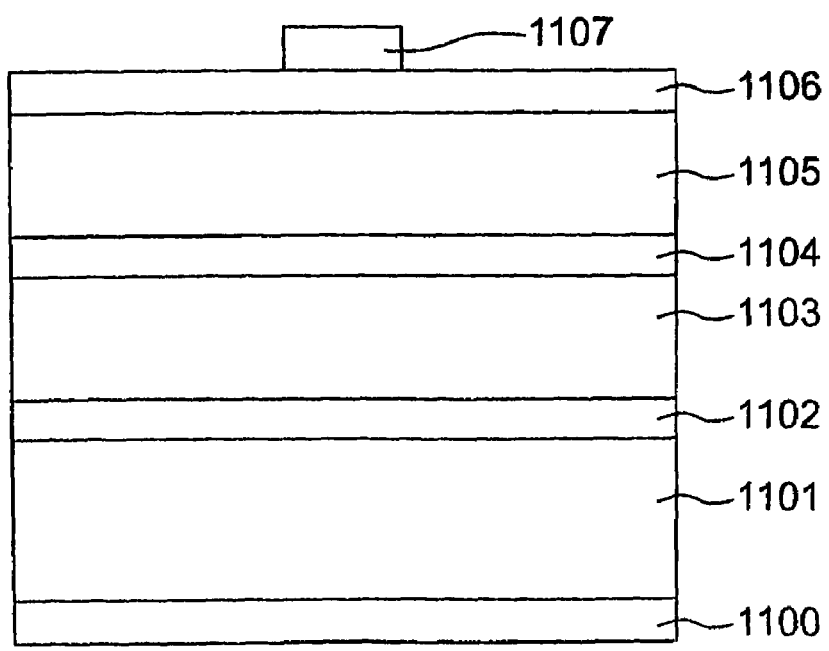
F I G. 27

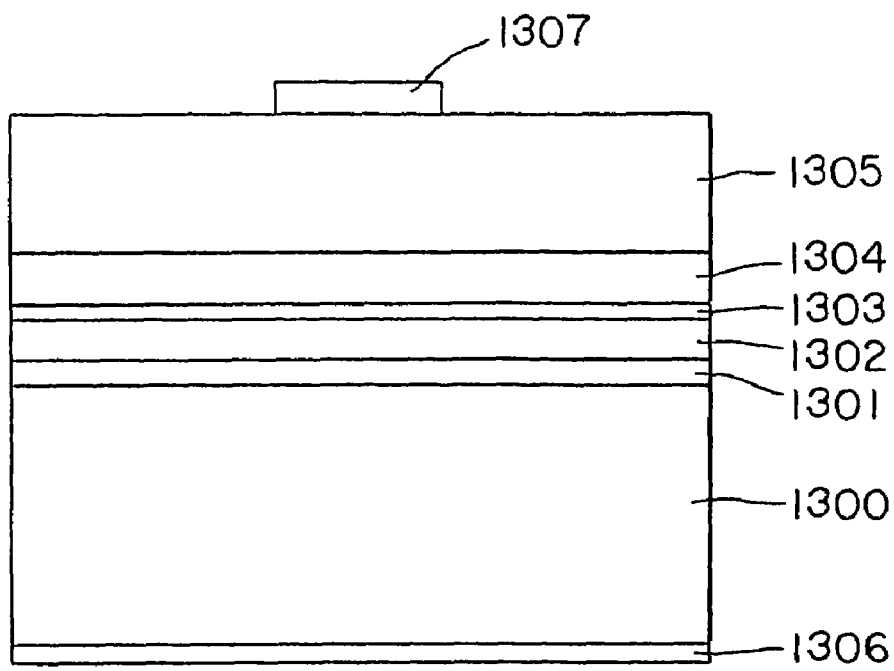
F I G. 29
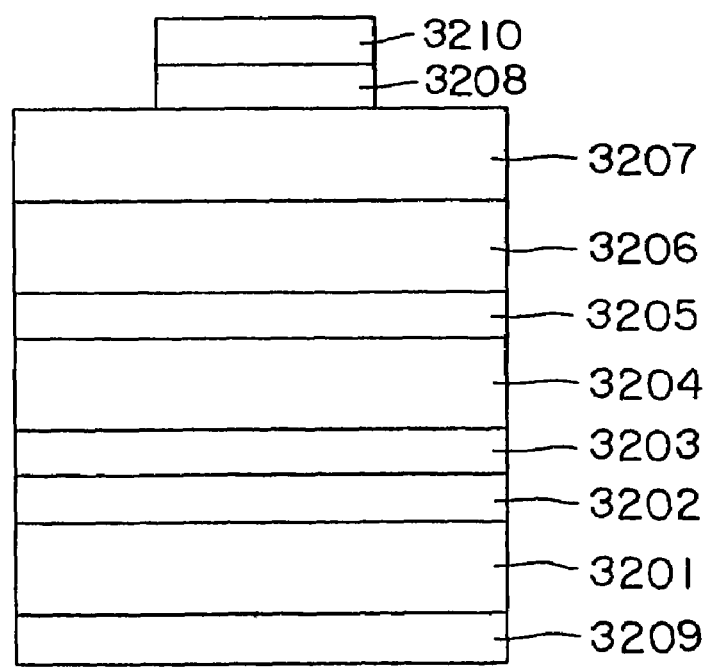
F I G. 30

SEMICONDUCTOR LIGHT-EMITTING ELEMENT

CROSS-REFERENCE TO RELATED APPLICATION

This application is a divisional application and claims the benefit of U.S. patent application Ser. No. 09/603,118 filed on Jun. 22, 2000 now U.S. Pat. No. 6,803,603, the disclosure of which is incorporated herein by reference.

BACKGROUND OF THE INVENTION

The present invention relates to a semiconductor light-emitting element.

In recent years, semiconductor light-emitting elements are widely used in an outdoor display, automobile indicator, and the like. The semiconductor light-emitting element is a device using emission recombination of electrons and holes injected in a p-n junction region. Emission ranging from infrared radiation to ultraviolet radiation can be realized by changing the semiconductor material of a light-emitting layer.

FIG. 30 shows the structure of a conventional semiconductor light-emitting element. An n-type GaAs buffer layer 3202, an n-type DBR (Distributed Bragg Reflector) reflective layer 3203 made of InGaAlP and GaAs to reflect light using the Bragg reflection effect, an n-type InGaAlP cladding layer 3204, an active layer 3205, a p-type InGaAlP cladding layer 3206, a p-type AlGaAs window layer 3207, and a p-type GaAs contact layer 3208 are sequentially formed on the upper surface of an n-type GaAs substrate 3201.

An n-type electrode 3209 is formed on the lower surface of the n-type GaAs substrate 3201, and a p-type electrode 3210 is formed on the p-type GaAs contact layer 3208. Power is supplied to the light-emitting element to emit light from the active layer 3205. Light emitted downward in FIG. 30 by the active layer 3205 is reflected by the reflective layer 3203, and radiated to above the element via the window layer 3207 together with the light emitted upward.

The conventional semiconductor light-emitting element suffers the following problem.

Part of light that is emitted downward by the active layer 3205 and travels straight toward the reflective layer 3203 is reflected by the reflective layer 3203 without being absorbed by the substrate 3201, and can be effectively extracted outside.

However, the reflective layer 3203 exhibits a very low reflectivity with respect to light traveling diagonally toward the reflective layer 3203, so not all the light from the active layer 3205 can be extracted outside.

The semiconductor light-emitting element absorbs light by a substrate which provides a critical angle defined by the difference in refractive index between the semiconductor crystal and the atmosphere or enables crystal growth. For this reason, light which can be extracted outside is only several % of internally emitted light.

FIG. 26 shows the structure of another semiconductor light-emitting element relating to the present invention.

A multilayered reflective film 1001, p-type contact layer 1002, p-type cladding layer 1003, active layer 1004 functioning as a light-emitting layer, n-type cladding layer 1005, and n-type contact layer 1006 are formed on a p-type semiconductor substrate 1000. An n-type electrode 1007 is formed on the contact layer 1002, whereas a p-type electrode 1008 is formed on the contact layer 1006.

Part of light emitted by the active layer 1004 that travels toward the n-type cladding layer 1005 is extracted outside via the cladding layer 1005.

Light that travels toward the p-type cladding layer 1003 is reflected by the multilayered reflective film 1001, and extracted outside via the n-type cladding layer 1005.

In this structure, light emitted toward the substrate 1000 can be reflected by the reflective film 1001, and extracted outside.

However, the reflectivity of light which is not vertically incident on the reflective film 1001 is low, the electrodes 1007 and 1008 which shield light exist on the light extraction surface, and the active layer 1004 is formed on the reflective film 1001. This results in low crystallinity and short service life.

FIG. 27 shows still another semiconductor light-emitting element relating to the present invention. An n-type InGaP buffer layer 1102, n-type InAlP cladding layer 1103, InGaAlP active layer 1104 functioning as a light-emitting layer, p-type InAlP cladding layer 1105, and p-type GaAs contact layer 1106 are formed on the upper surface of an n-type GaP substrate 1101. A p-type electrode 1107 is formed on the p-type GaAs contact layer 1106, while an n-type electrode 1100 is formed on the lower surface of the substrate 1101.

Light emitted by the InGaAlP active layer 1104 is reflected by the n- and p-type electrodes 1100 and 1107, and extracted outside from a region of the contact layer 1106 which is not shielded by the p-type electrode 1107.

In this structure, however, light concentrated immediately below the electrode 1107 is shielded by the electrode 1107, and cannot be extracted outside.

In the element shown in FIG. 27, only several % of light emitted by the active layer 1104 can be extracted outside owing to the difference in refractive index between the crystal and the air.

As the semiconductor light-emitting element, a compound semiconductor light-emitting element using a GaAs-based semiconductor material is adopted to emit light ranging from red to green, and a gallium nitride-based compound semiconductor light-emitting element using Al(x)Ga(y)In(1−x−y)N (0≦x, y≦1, x+y≦1) is adopted to emit light from the ultraviolet range to the blue/green range.

However, the refractive indices of these light-emitting elements are high (GaN=2.67, GaAs=3.62), their critical angles are small (GaN=21.9°, GaAs=16.0°), and thus their light extraction efficiencies are low.

The GaAs system exhibits large light absorption on the substrate. Emitted light is absorbed by the substrate to decrease the light extraction efficiency.

FIG. 29 shows still another semiconductor light-emitting element relating to the present invention.

An n-type GaAs buffer layer 1301, n-type InGaAlP cladding layer 1302, InGaAlP active layer 1303, p-type InGaAlP cladding layer 1304, and p-type AlGaAs current diffusion layer 1305 are sequentially grown on the upper surface of an n-type GaAs substrate 1300. A p-side electrode pad 1307 is formed on the p-type AlGaAs current diffusion layer 1305, whereas an n-side electrode 1306 is formed on the lower surface of the n-type GaAs substrate 1300.

In this structure, a current flowing from the p-side electrode 1307 is widened by the p-type AlGaAs current diffusion layer 1305, and injected from the p-type InGaAlP cladding layer 1304 to the InGaAlP active layer 1303. The light is extracted outside the element via the p-type AlGaAs current diffusion layer 1305.

In the GaAs-based compound semiconductor light-emitting element having this structure, part of light emitted by the active layer 1303 that travels toward the substrate 1300 is absorbed by the substrate 1300, and cannot be extracted outside the element. More specifically, 50% of the emitted light cannot be extracted, which is fatal to high luminance.

As described above, the elements relating to the present invention suffer low light extraction efficiency.

SUMMARY OF THE INVENTION

The present invention has been made in consideration of the above situation, and has as its object to provide a semiconductor light-emitting element capable of efficiently extracting light emitted by a light-emitting layer outside the element.

According to the present invention, there is provided a semiconductor light-emitting element comprising a substrate, a reflective layer which is formed on the substrate, contains a metal, and reflects light, a light-emitting layer formed on the reflective layer to emit light, and a transparent electrode formed on the light-emitting layer to transmit light.

The light-emitting layer desirably has a double-heterostructure in which an active layer is sandwiched between first and second cladding layers.

The semiconductor light-emitting element can further comprise an electrode of one conductivity type between a surface of the substrate and the reflective layer, a contact layer of the one conductivity type between the reflective layer and the light-emitting layer, and a contact layer of an opposite conductivity type between the light-emitting layer and the transparent electrode.

The semiconductor light-emitting element can further comprise an electrode of one conductivity type between a surface of the substrate and the reflective layer, a contact layer of the one conductivity type between the reflective layer and the light-emitting layer, and a contact layer of an opposite conductivity type between the light-emitting layer and the transparent electrode.

The semiconductor light-emitting element can further comprise a strain relaxing layer which is sandwiched between the contact layer of one conductivity type and the first cladding layer, and has a middle band gap between band gaps of the contact layer of the one conductivity type and the first cladding layer.

The contact layer of the one conductivity type and the contact layer of the opposite conductivity type may contain InGaP or InGaAlP.

The semiconductor light-emitting element can further comprise an intermediate layer between the electrode of the one conductivity type and the reflective layer.

The reflective layer may have a two-layered structure made up of a transparent conductive film and a metal.

The transparent electrode may be formed using an ITO film.

If the substrate contains a metal, preferable heat dissipation can be attained.

Compositions of first and second cladding layers are desirably adjusted to set band gaps of the first and second cladding layers to be larger than a band gap of an active layer.

An active layer may have a single or multiple quantum well structure including a well layer and a barrier layer.

According to the present invention, the reflective layer made of a metal can obtain a high reflectivity regardless of the angle of incident light on the reflective layer. Light emitted inside the element can be efficiently extracted outside.

A semiconductor light-emitting element according to the present invention comprises a transparent semiconductor substrate, a buffer layer formed on the semiconductor substrate and lattice-matched with the semiconductor substrate, a light-emitting layer formed on the buffer layer, a first electrode formed on the buffer layer, and a second light-reflecting electrode formed on the light-emitting layer.

According to the present invention, light is extracted from the transparent substrate to increase the light extraction efficiency and luminance. The buffer layer lattice-matched with the substrate can prolong the service life with high crystallinity.

A semiconductor light-emitting element according to the present invention comprises a semiconductor substrate, a light-emitting layer formed on the semiconductor substrate, and first and second electrodes formed on the same plane, wherein the semiconductor substrate has a light extraction window so as to pass light emitted by the light-emitting layer.

The first and second electrodes are formed on the same plane. One of these electrodes can be directly formed on a heat sink to increase the luminance without saturating a light output up to a large current.

A semiconductor light-emitting element manufacturing method according to the present invention comprises the steps of forming a buffer layer on a transparent semiconductor substrate so as to be lattice-matched with the semiconductor substrate, sequentially forming a first contact layer, a first cladding layer, a light-emitting layer, a second cladding layer, and a second contact layer on the buffer layer, partially removing the first cladding layer, the light-emitting layer, the second cladding layer, and the second contact layer to expose a surface of the first contact layer, forming a first electrode on the exposed surface of the first contact layer, and forming a second light-reflecting electrode on a surface of the second contact layer.

A semiconductor light-emitting element manufacturing method according to the present invention comprises the steps of sequentially forming a buffer layer, a first contact layer, a first cladding layer, a light-emitting layer, a second cladding layer, and a second contact layer on a semiconductor substrate, partially removing the first cladding layer, the light-emitting layer, the second cladding layer, and the second contact layer to expose a surface of the first contact layer, forming a first electrode on the exposed surface of the first contact layer, forming a second light-reflecting electrode on a surface of the second contact layer, and forming a light extraction window at a portion of the semiconductor substrate at which the light extraction window faces the second electrode.

A semiconductor light-emitting element according to the present invention comprises a transparent semiconductor substrate, a double-heterostructure which is formed on the semiconductor substrate and contains a light-emitting layer and first and second cladding layers that sandwich two surfaces of the light-emitting layer, and a contact layer which is formed on the double-heterostructure and has a recessed surface.

Since the recessed region is set on the contact layer formed on the transparent substrate, light from the light-emitting layer can be reflected to the side surface or the like, and effectively extracted outside the element. Thus, the light extraction efficiency increases.

A semiconductor light-emitting element manufacturing method according to the present invention comprises the steps of sequentially forming a buffer layer, a first cladding layer, a light-emitting layer, a second cladding layer, and a contact layer on a transparent semiconductor substrate, recessing a surface of the contact layer, forming a first light-reflecting electrode on the surface of the contact layer, and forming a second electrode on a surface of the semiconductor substrate so as to remove a portion at which the second electrode faces the first electrode.

Alternatively, a semiconductor light-emitting element manufacturing method according to the present invention comprises the steps of forming a buffer layer on a transparent semiconductor substrate so as to be lattice-matched with the semiconductor substrate, sequentially forming a first cladding layer, a light-emitting layer, a second cladding layer, and a contact layer on the buffer layer, recessing a surface of the contact layer, forming a first light-reflecting electrode on the surface of the contact layer, and forming a second electrode on a surface of the semiconductor substrate.

A semiconductor light-emitting element according to the present invention comprises at least a light-emitting layer formed on a semiconductor substrate, wherein a shape of the semiconductor light-emitting element is a polygonal prism having at least five corners or a circular cylinder.

Since the element shape is a polygonal prism or circular cylinder, light reflected by the end face is reduced, compared to a quadrangular prism. Light inside the element can be effectively extracted outside from the end face to increase the light extraction efficiency.

A semiconductor light-emitting element according to the present invention having a light-emitting layer for emitting light in a direction of plane comprises a photonics crystal layer on at least one surface of the light-emitting layer.

The photonics crystal layer may be formed on the light-emitting layer on a side of a compound semiconductor light-emitting element opposite to a light extraction surface.

Alternatively, the photonics crystal layer may be formed on the light-emitting layer on a light extraction surface side of the semiconductor light-emitting element, and a through dislocation may exist on the light extraction surface in a substantially vertical direction to pass light emitted by the light-emitting layer.

A semiconductor light-emitting element according to the present invention comprises a semiconductor substrate, a contact layer formed on the semiconductor substrate, a first cladding layer formed on the contact layer, a light-emitting layer formed on the first cladding layer, and a second cladding layer formed on the light-emitting layer, wherein an interface of the contact layer in contact with the first cladding layer is corrugated to have a gradient index, and light emitted by the light-emitting layer is reflected by the interface.

A semiconductor light-emitting element according to the present invention comprises a semiconductor substrate, and a light-emitting layer formed on the semiconductor substrate, wherein the semiconductor substrate has a rounded edge.

Alternatively, a semiconductor light-emitting element according to the present invention comprises a photonics crystal layer, and at least one light-emitting element formed on each of two surfaces of the photonics crystal layer, wherein the light-emitting elements emit light with different emission wavelengths.

A semiconductor light-emitting element according to the present invention comprises a transparent semiconductor substrate, a Bragg reflective layer formed on the semiconductor substrate, an active layer formed on the Bragg reflective layer, and a photonics crystal layer formed on the active layer.

A semiconductor light-emitting element manufacturing method according to the present invention comprises the steps of sequentially forming a buffer layer, a first cladding layer, a light-emitting layer, and a second cladding layer on a first semiconductor substrate, forming a photonics crystal layer on the second semiconductor substrate, fusing the second cladding layer and the photonics crystal layer, and removing the first semiconductor substrate and the buffer layer.

Alternatively, a semiconductor light-emitting element manufacturing method according to the present invention comprises the steps of sequentially forming a buffer layer, a contact layer, a first cladding layer, a light-emitting layer, and a second cladding layer on a first transparent semiconductor substrate, forming a photonics crystal layer on a second semiconductor substrate, fusing the first semiconductor substrate and the photonics crystal layer, and removing the second semiconductor substrate, wherein the photonics crystal layer contains a through dislocation on a light extraction surface in a substantially vertical direction to pass light emitted by the light-emitting layer.

Alternatively, a semiconductor light-emitting element manufacturing method according to the present invention comprises the steps of forming a contact layer on a semiconductor substrate, corrugating a surface of the contact layer, and sequentially forming a first cladding layer, a light-emitting layer, and a second cladding layer on the contact layer, wherein a gradient index is given by the corrugated interface of the contact layer in contact with the first cladding layer, and light emitted by the light-emitting layer is reflected by the interface.

A semiconductor light-emitting element manufacturing method according to the present invention comprises the steps of forming at least a light-emitting layer on a semiconductor substrate, and processing an edge of the semiconductor substrate to round the edge.

A semiconductor light-emitting element manufacturing method according to the present invention comprises the steps of forming a buffer layer on a first transparent semiconductor substrate, forming a Bragg reflective layer on the buffer layer, sequentially forming a light-emitting layer, a cladding layer, and a bonding layer on the Bragg reflective layer, forming a photonics crystal layer on a second semiconductor substrate, bonding the cladding layer and the photonics crystal layer via the bonding layer, and removing the second semiconductor substrate.

A region having a gradient index inside the photonics crystal layer or semiconductor layer is formed on one surface of the light-emitting layer. Thus, light emitted by the light-emitting layer can be efficiently extracted outside the element to increase the extraction efficiency and luminance.

BRIEF DESCRIPTION OF THE DRAWINGS

FIG. 2 is a longitudinal sectional view showing the structure of a semiconductor light-emitting element according to the second embodiment of the present invention;

FIG. 3 is a longitudinal sectional view showing the structure of a semiconductor light-emitting element according to the third embodiment of the present invention;

FIG. 6 is a longitudinal sectional view showing the longitudinal section of the element in a step subsequent to the step shown in FIG. 5 in the semiconductor light-emitting element manufacturing method;

FIG. 11 is a longitudinal sectional view showing the structure of a semiconductor light-emitting element according to the seventh embodiment of the present invention;

FIG. 12 is a longitudinal sectional view showing the structure of a semiconductor light-emitting element according to the eighth embodiment of the present invention;

FIG. 13 is a longitudinal sectional view showing the structure of a semiconductor light-emitting element according to the ninth embodiment of the present invention;

FIG. 14 is a longitudinal sectional view showing the structure of a semiconductor light-emitting element according to the tenth embodiment of the present invention;

FIG. 15 is a longitudinal sectional view showing the structure of a semiconductor light-emitting element according to the eleventh embodiment of the present invention;

FIG. 16 is a longitudinal sectional view showing the structure of a semiconductor light-emitting element according to the twelfth embodiment of the present invention;

FIG. 17 is a longitudinal sectional view showing the structure of a semiconductor light-emitting element according to the thirteenth embodiment of the present invention;

FIG. 21 is a longitudinal sectional view showing the another method for forming a roughness on the surface of the GaN layer of the semiconductor light-emitting element according to the fifteenth embodiment of the present invention;

FIG. 26 is a longitudinal sectional view showing the structure of a conventional semiconductor light-emitting element;

FIG. 27 is a longitudinal sectional view showing the structure of another conventional semiconductor light-emitting element;

FIG. 29 is a longitudinal sectional view showing the structure of a further other conventional semiconductor light-emitting element;

FIG. 30 is a longitudinal sectional view showing the structure of a further other conventional semiconductor light-emitting element.

DESCRIPTION OF THE PREFERRED EMBODIMENTS

Preferred embodiments of the present invention will be described below with reference to the accompanying drawings.

(1) The First Embodiment

Figure 1:
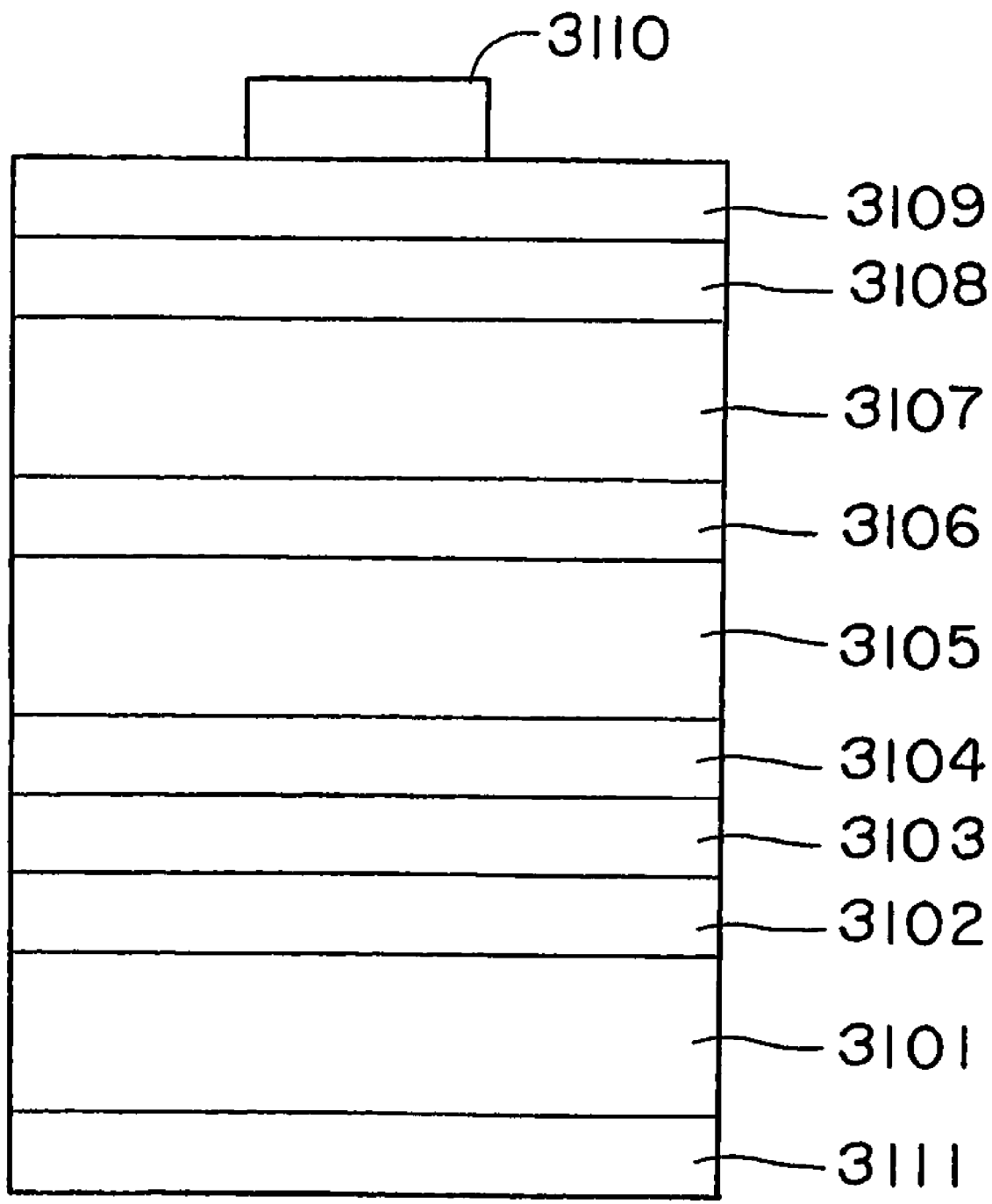
FIG. 1 is a longitudinal sectional view showing the structure of a semiconductor light-emitting element according to the first embodiment of the present invention.

FIG. 1 shows the structure of a semiconductor light-emitting element according to the first embodiment of the present invention.

P-type Au/Zn electrodes 3102 and 3103, a p-type GaAs contact layer 3104, a p-type cladding layer 3105 made of $In(x')Ga(y')Al(1-x'-y')P$, an active layer 3106 made of $In(x'')Ga(y'')Al(1-x''-y'')P$, an n-type cladding layer 3107 made of $In(x''')Ga(y''')Al(1-x'''-y''')P$, an n-type GaAs contact layer 3108, an ITO (Indium Tin Oxide) transparent electrode 3109, and a bonding Cr/An electrode 3110 are sequentially formed on the upper surface of a p-type silicon substrate 3101. A p-type electrode 3111 is formed on the lower surface of the substrate 3101. A voltage is applied between the electrodes 3110 and 3111 to supply power to the light-emitting element and emit light from the active layer 3106.

In this structure, part of light that is emitted upward in FIG. 1 by the active layer 3106 passes through the transparent cladding layer 3107 and thin-film GaAs contact layer 3108. The light further passes through the transparent electrode 3109 and radiates outside.

Light emitted downward by the active layer 3106 passes through the cladding layer 3105 and thin-film contact layer 3104. The light is reflected by the electrode 3103 functioning as a reflective layer, radiated to above the element, and extracted outside.

Since the electrode 3103 is made of a metal, unlike a conventional reflective layer, the electrode 3103 hardly changes in reflectivity with respect to the incident angle, and reflects almost all light. Thus, light can be efficiently extracted.

If the n- and p-type contact layers are made of InGaP or InGaAlP, the band gap difference between each contact layer and the corresponding cladding layer decreases to further reduce the operating voltage.

Since the metal electrode 3110 is formed on the upper surface of the transparent electrode 3109, stress strain applied to the active layer 3106 by the transparent electrode 3109 can be relaxed to improve the reliability.

If the p-type electrode 3103 has a layered structure of a transparent conductive layer and a metal containing Al or Ag, the reflectivity can be increased to increase the light output from the light-emitting element.

(2) The Second Embodiment

The second embodiment of the present invention will be described with reference to FIG. 2. An SnPb solder layer 3302, a p-type Au/Zn electrode 3303, a p-type GaAs contact layer 3304 having a thickness of 500 Å and a carrier concentration of 1E19 cm$^{-3}$, a p-type cladding layer 3305 made of In(x')Ga(y')Al(1−x'−y')P(0=<(x',y')=<1) with a thickness of 2 μm and a carrier concentration of 5E18 cm$^{-3}$, an active layer 3306 made of In(x")Ga(y")Al(1−x"−y")P (0=<(x",y")=<1), an n-type cladding layer 3307 made of In(x''')Ga(y''')Al(1−x'''−y''')P(0=<(x''',y''')=<1) with a thickness of 1.5 μm and a carrier concentration of 3E18 cm$^{-3}$, an n-type GaAs contact layer 3308 having a thickness of 500 Å and a carrier concentration of 1E19 cm$^{-3}$, an ITO (Indium Tin Oxide) transparent electrode 3309, and a bonding Cr/An electrode 3310 are formed on the upper surface of an Al substrate 3301.

In the structure of the second embodiment, a light-emitting layer with a double-heterostructure made up of the active layer 3306 and cladding layers 3305 and 3307 is formed on the Al substrate 3301. Heat generated in the active layer 3306 dissipates via the Al substrate 3301. As a result, the semiconductor light-emitting element can operate without decreasing the light output even at a high temperature of 100° C.

In this case, the compositions (x', x''', y', y''') of the cladding layers 3305 and 3307 and the composition (x", y") of the active layer 3306 are adjusted such that the band gaps of the cladding layers 3305 and 3307 become larger than that of the active layer 3306. This enables setting sufficiently high densities of electrons and holes contributing to emission, increasing the light output. If the active layer 3306 is formed into a single or multiple quantum well structure made up of a well layer several ten Å thick and a barrier layer several ten Å thick, a large light output can be obtained with a small current. By changing the composition of the active layer 3306, the semiconductor light-emitting element can emit light from red to green. If the n- and p-type contact layers are made of InGaP or InGaAlP, light can be extracted without being absorbed by the contact layers.

(3) The Third embodiment

The third embodiment of the present invention will be described with reference to FIG. 3. N-type Au/Ge electrodes 3411 and 3402 are respectively formed on the lower and upper surfaces of an n-type silicon substrate 3401. A p-type Au/Ni/Au electrode 3403, a p-type GaN contact layer 3404, a p-type AlGaN cladding layer 3405, an InGaN active layer 3406, an n-type AlGaN cladding layer 3407, an n-type GaN contact layer 3408, an ITO transparent electrode 3409, and a bonding Cr/An electrode 3410 are formed on the surface of the n-type electrode 3402.

According to this embodiment, a current can be spread by the ITO transparent electrode 3409 and injected to the entire active layer 3406 to cause the entire region of the active layer 3406 to emit light. Light emitted upward by the active layer 3406 passes through the transparent cladding layer 407, further passes through the contact layer 408 and electrode 3409, and radiates outside. Light emitted downward by the active layer 3406 passes through the cladding layer 3405 and contact layer 3404. Then, all the light is reflected by the p-type electrode 3403, radiated upward, and extracted outside.

Since the electrode 3403 serving as a reflective layer is made of a metal, the electrode 3403 reflects all light without absorbing it, and the light can be efficiently extracted outside. If the electrode 3403 is made of a metal containing Al or Ag, its reflectivity can be increased to increase light output.

The cladding layer may be made of In(x1)Ga(y1)Al(1−x1−y1)N, and the band gap can be controlled by changing the compositions x1 and y1. Similarly, the active layer 3406 may be made of In(x2)Ga(y2)Al(1−x2−y2)N, and emission from infrared radiation to ultraviolet radiation can be realized by changing the compositions x2 and y2. If the cladding and active layers have the same lattice constant, high luminance can be realized with a small current. For ultraviolet radiation, the ITO transparent electrode 3409 is made as thin as several hundred Å or uses a thin metal film several 10 Å thick, thereby increasing light output.

(4) The Fourth Embodiment

A method of manufacturing the semiconductor light-emitting element of the first embodiment will be explained as the fourth embodiment of the present invention with reference to FIGS. 4 to 8.

Figure 4:
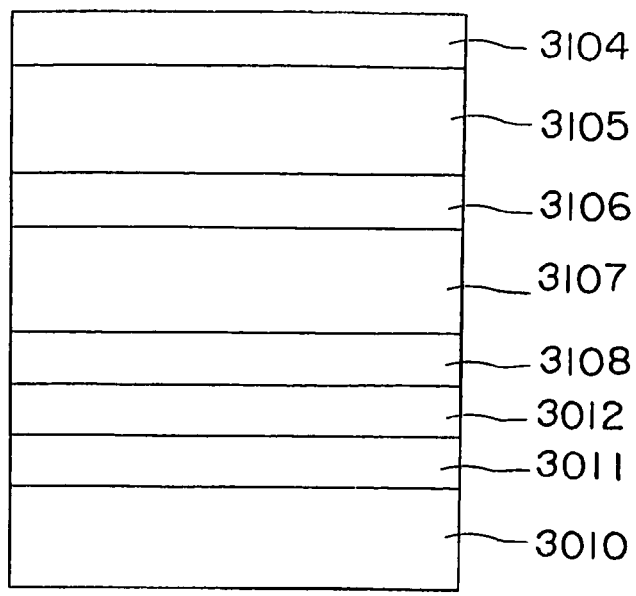
FIG. 4 is a longitudinal sectional view showing the longitudinal section of an element in one step of a semiconductor light-emitting element manufacturing method according to the fourth embodiment of the present invention.

As shown in FIG. 4, a GaAs buffer layer 3011, an InGaAlP selective etching layer 3012, an n-type GaAs contact layer 3108, an n-type InGaAlP cladding layer 3107, an InGaAlP active layer 3106, an InGaAlP cladding layer 3105, and a p-type GaAs contact layer 3104 are sequentially grown on a GaAs substrate 3010 using MOCVD or MBE.

Figure 5:
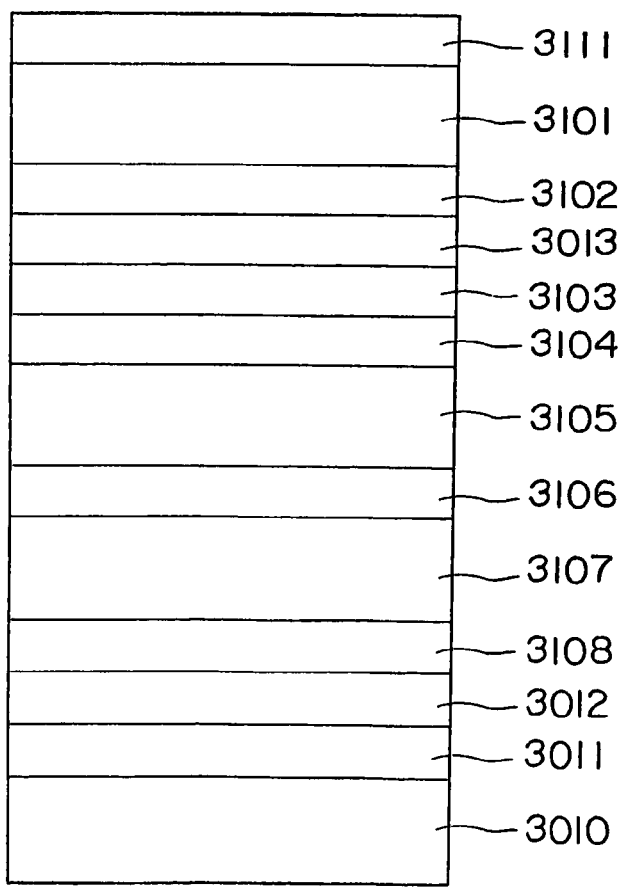
FIG. 5 is a longitudinal sectional view showing the longitudinal section of the element in a step subsequent to the step shown in FIG. 4 in the semiconductor light-emitting element manufacturing method.

As shown in FIG. 5, a p-type electrode 3103 is formed on the surface of the contact layer 3104, and adhered via a solder layer 3013 of SnPb or the like to a p-type silicon substrate 3101 having p-type electrodes 3102 and 3111 formed on its lower and upper surfaces.

After the end face of the wafer is covered with wax except for the selective etching layer 3012, the selective etching layer 3012 is etched away with phosphoric acid or sulfuric acid, as shown in FIG. 6. In this case, heating the phosphoric acid or sulfuric acid to a high temperature facilitates removal by etching.

Figure 7:
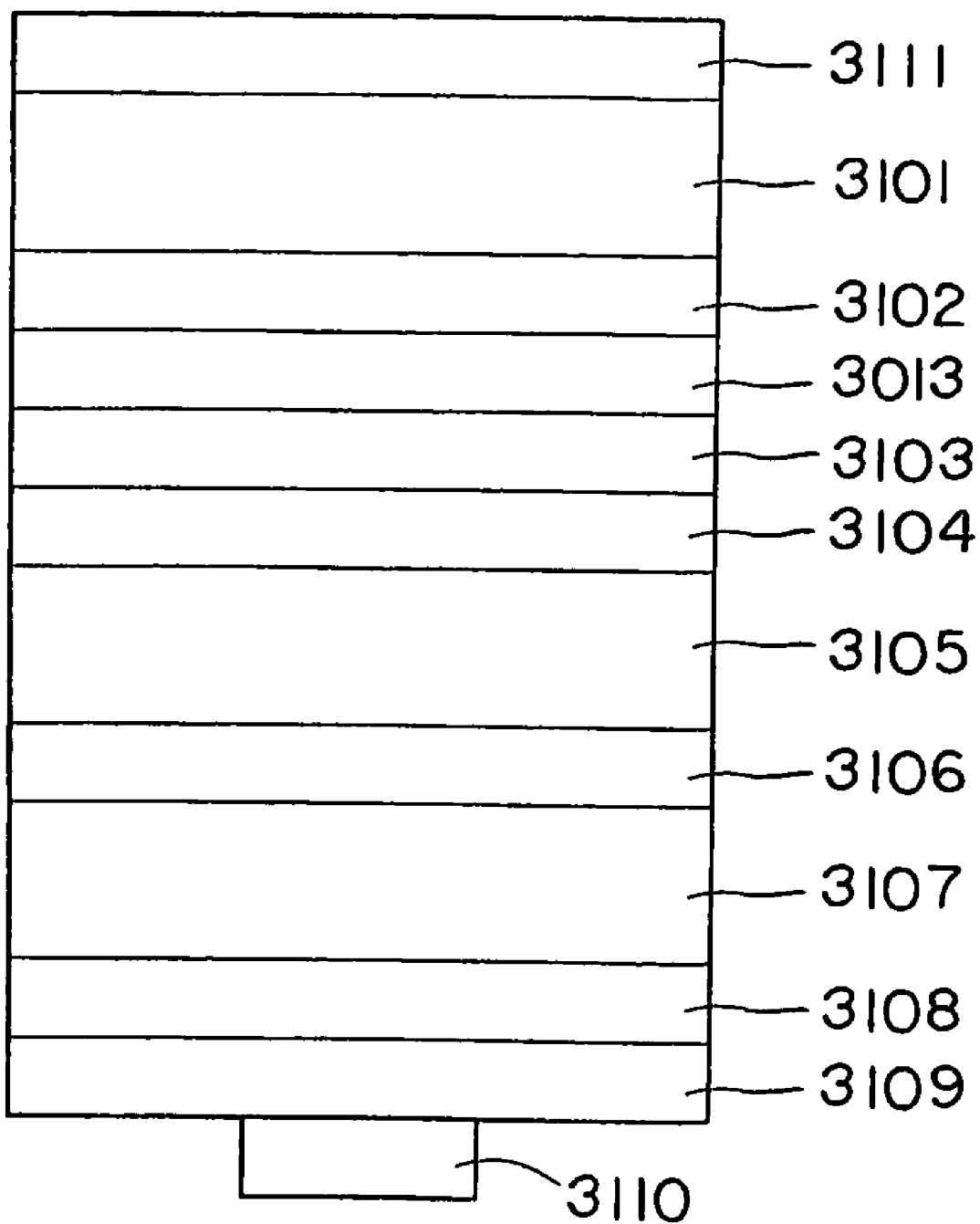
FIG. 7 is a longitudinal sectional view showing the longitudinal section of the element in a step subsequent to the step shown in FIG. 6 in the semiconductor light-emitting element manufacturing method.

As shown in FIG. 7, a transparent electrode 3109 and bonding electrode 3110 are formed on the surface of the contact layer 3108. The resultant wafer is divided into a plurality of chips by scribing or dicing.

Figure 8:
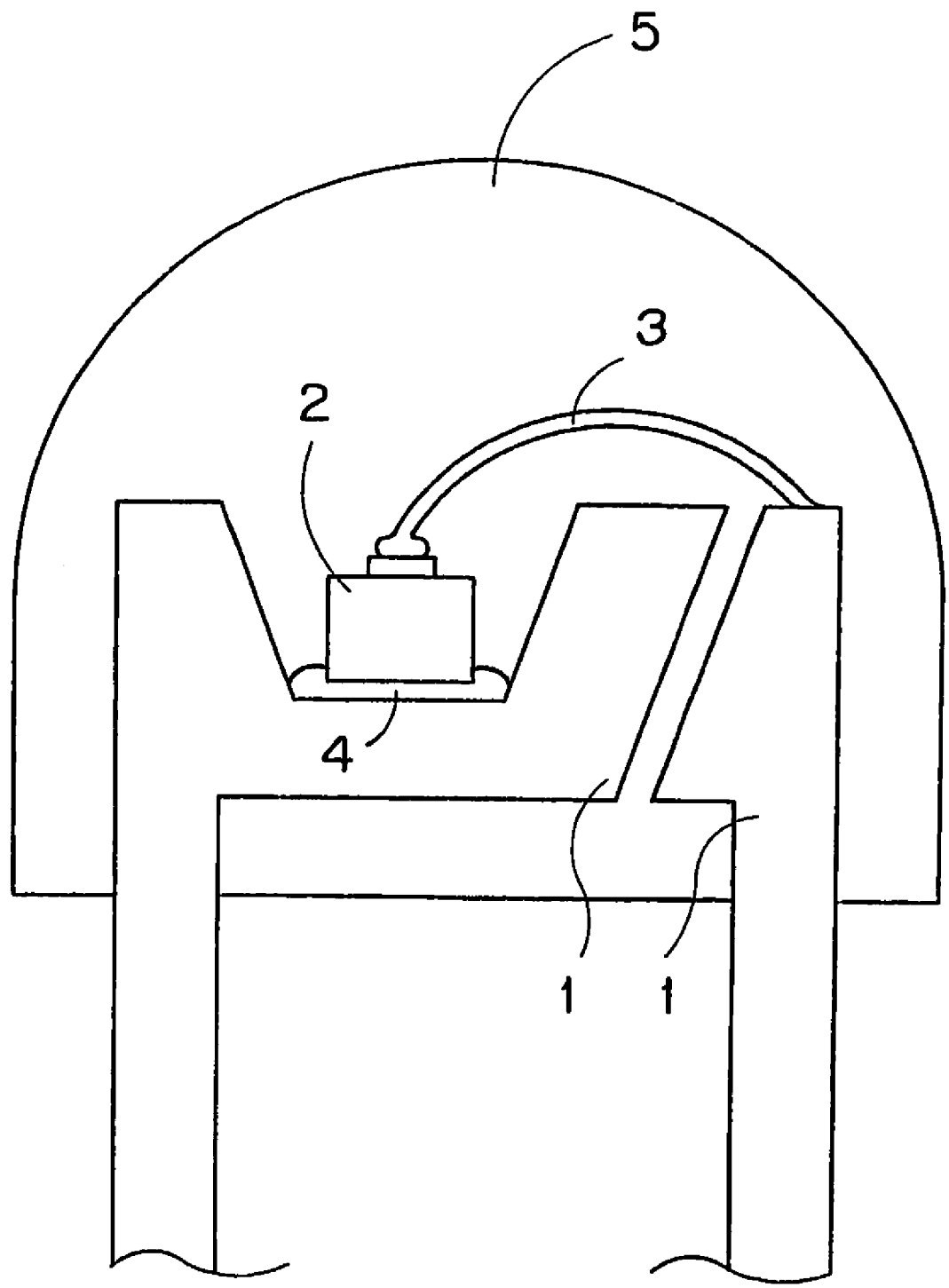
FIG. 8 is a longitudinal sectional view showing the longitudinal section of the element in a step subsequent to the step shown in FIG. 7 in the semiconductor light-emitting element manufacturing method.

As shown in FIG. 8, an LED chip 2 is placed on a frame 1 or substrate using Ag paste 4 or the like, and bonded to the frame 1 or substrate using an Au wire 3. Then, a resin mold 5 is formed to cover the LED chip 2 and Au wire 3.

The above-described embodiments are merely examples, and do not limit the present invention. The substrate may be a p- or n-type silicon substrate, like the first and third embodiments, or may be made of a metal such as Al, like the second embodiment. The metal is not limited to Al, and may be Cu, Fe, or stainless steel.

A substrate made of such metal exhibits a large heat dissipation effect. Hence, even when a large current of several 10 A flows, saturation of light output by heat generation does not occur, and the semiconductor light-emitting element can operate even at a temperature of 100° C.

(5) The Fifth Embodiment

Figure 9:
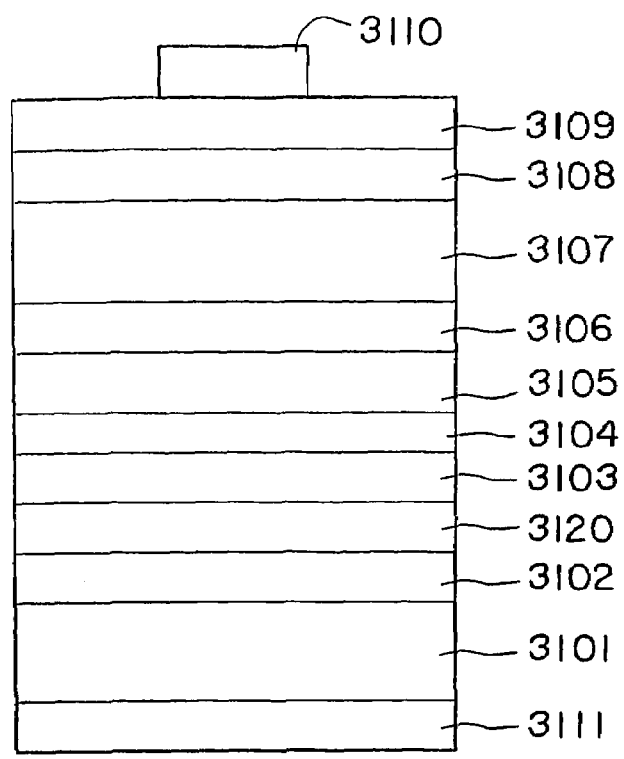
FIG. 9 is a longitudinal sectional view showing the structure of a semiconductor light-emitting element according to the fifth embodiment of the present invention.

In the first embodiment, the electrodes 3102 and 3103 directly contact each other. Alternatively, like the fifth embodiment shown in FIG. 9, an intermediate layer 3120 made of In, Ag, Ni, Cr, or the like may be sandwiched between the electrodes 3102 and 3103. In this case, thermal strain of the active layer can be reduced to improve the reliability.

(6) The Sixth Embodiment

Figure 10:
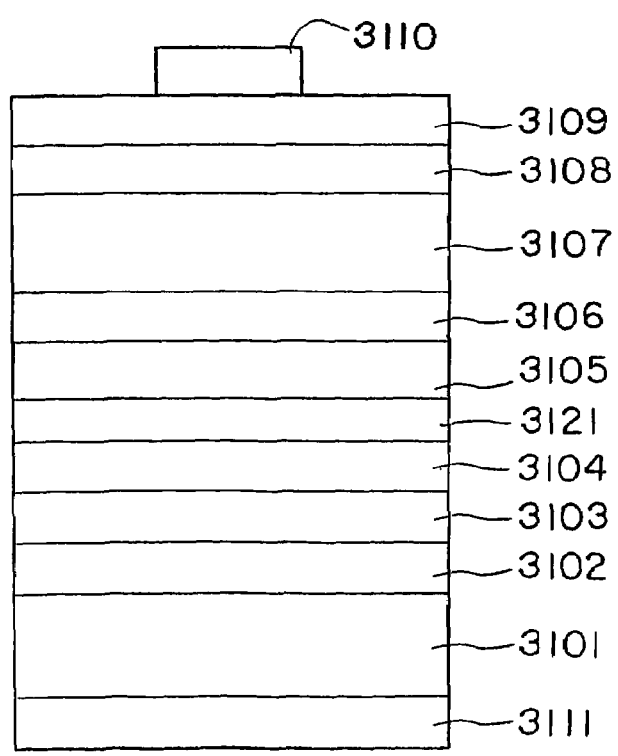
FIG. 10 is a longitudinal sectional view showing the structure of a semiconductor light-emitting element according to the sixth embodiment of the present invention.

In the first embodiment, the p-type contact layer 3104 and p-type cladding layer 3105 directly contact each other. Alternatively, like the sixth embodiment shown in FIG. 10, a strain relaxing layer may be sandwiched between the p-type contact layer 3104 and the p-type cladding layer 3105. This structure can prevent dislocations from the heterojunction caused by current injection. Doping In into the strain relaxing layer can soften the crystal structure and suppress an increase in dislocations.

(7) The Seventh Embodiment

FIG. 11 shows the structure of a semiconductor light-emitting element according to the seventh embodiment of the present invention.

An $In(x1)Ga(y1)Al(1-x1-y1)P$ buffer layer 101, n-type $In(x2)Ga(y2)Al(1-x2-y2)P$ contact layer 102, n-type $In(x3)Ga(y3)Al(1-x3-y3)P$ cladding layer 103, $In(x4)Ga(y4)Al(1-x4-y4)P$ active layer 104, p-type $In(x5)Ga(y5)Al(1-x5-y5)P$ cladding layer 105, and p-type $In(x6)Ga(y6)Al(1-x6-y6)P$ contact layer 106 are sequentially formed on a transparent ZnSe semiconductor substrate 100.

An n-type AuGe electrode 107 is formed on the partially etched n-type contact layer 102, whereas a p-type AuZn electrode 108 is formed on the p-type contact layer 106. In this case, $0<=x1, \ldots, x6, y1, \ldots, y6, x1+y1, \ldots, x6+y6<=1$.

The electrode material can desirably ohmic-contact the contact layer, and exhibit a high light reflectivity.

Light emitted by the active layer 104 is extracted outside via the semiconductor substrate 100. Light traveling toward the p-type electrode 108 is reflected by the electrode 108, and extracted outside via the substrate 100. Since no obstacle exists on the light extraction surface, light inside the element can be effectively extracted to increase the light extraction efficiency.

ZnSe used for the substrate 100 has a lattice constant of 5.667 Å. This lattice constant can be controlled from 5.451 Å to 5.868 Å by changing the compositions x and y of the $In(x)Ga(y)Al(1-x-y)P$ layer formed on the substrate 100. Thus, the light-emitting layer 104 which is lattice-matched with the ZnSe substrate 100 or is not lattice-matched but has a thickness falling within the critical film thickness can be formed with high crystallinity.

The compositions of the cladding layer 103 and contact layer 106 are adjusted to be larger than the band gap of the active layer 104. This can realize a structure free from any internal absorption.

By changing the composition of the active layer 104, light ranging from red to green can be emitted. If the active layer 104 is formed into a single or multiple quantum well structure using a quantum well layer several ten Å thick, high emission efficiency and long service life can be attained.

The n-type electrode 107 is formed by ion-implanting or diffusing an n-type impurity in the p-type contact layer 106. The p- and n-type electrodes 108 and 107 are formed on the same plane. This enables directly adhering the p-type electrode 108 to a heat sink. Since heat can satisfactorily dissipate, the semiconductor light-emitting element can operate up to a large current of several A without saturating a light output.

(8) The Eighth Embodiment

FIG. 12 shows the structure of a semiconductor light-emitting element according to the eighth embodiment of the present invention.

An $In(x1)Ga(y1)Al(1-x1-y1)P$ buffer layer 201, n-type $In(x2)Ga(y2)Al(1-x2-y2)P$ contact layer 202, n-type $In(x3)Ga(y3)Al(1-x3-y3)P$ cladding layer 203, $In(x4)Ga(y4)Al(1-x4-y4)P$ active layer 204, p-type $In(x5)Ga(y5)Al(1-x5-y5)P$ cladding layer 205, and p-type $In(x6)Ga(y6)Al(1-x6-y6)P$ contact layer 206 are sequentially formed on a GaAs semiconductor substrate 200.

An n-type AuGe electrode 207 is formed on the partially etched n-type contact layer 202, whereas a p-type AuZn electrode 208 is formed on the p-type contact layer 206.

A light extraction window 209 is formed in the substrate 200 at a position where the light extraction window 209 faces the p-type electrode 208 via the active layer 204 so as to extract light. In this case, $0<=x1, \ldots, x6, y1, \ldots, y6, x1+y1, \ldots, x6+y6<=1$.

Light emitted by the active layer 204 is extracted outside via the light extraction window 209. Light traveling toward the p-type electrode 208 is reflected by the electrode 208, and extracted outside via the window 209.

As for the size of the electrode 208, if the electrode 208 is larger than the light extraction window 209, part of light is absorbed by the substrate 200, and cannot be sufficiently extracted. Thus, the electrode 208 is desirably smaller than the light extraction window 209. Since light emitted by the active layer 204 can be effectively extracted, a light output from the element increases.

The eighth embodiment can effectively extract internal light because no obstacle exists on the light extraction surface. The compositions of the cladding layers 203 and 205 and contact layers 202 and 206 are adjusted to be larger than the band gap of the active layer 204. This can realize a structure free from any internal absorption.

By changing the composition of the active layer 204, light ranging from red to green can be emitted.

If the active layer 204 is formed into a single or multiple quantum well structure using a quantum well layer several ten Å thick, high emission efficiency and long service life can be attained.

The n-type electrode 207 is formed on the same plane as the p-type electrode 208 by forming a region in which an n-type impurity is ion-implanted or diffused from the p-type contact layer 206. This enables directly adhering the p-type electrode 208 to a heat sink, so that the semiconductor light-emitting element can operate up to a large current of several Å without saturating a light output.

(9) The Ninth Embodiment

FIG. 13 shows the structure of an element according to the ninth embodiment of the present invention.

An n-type $In(x1)Ga(y1)Al(1-x1-y1)P$ buffer layer 301, n-type $In(x2)Ga(y2)Al(1-x2-y2)P$ cladding layer 302, n-type $In(x3)Ga(y3)Al(1-x3-y3)P$ active layer 303, p-type $In(x4)Ga(y4)Al(1-x4-y4)P$ cladding layer 304, and p-type $In(x5)Ga(y5)Al(1-x5-y5)P$ contact layer 305 are sequentially formed on the upper surface of an n-type GaP substrate 300. An n-type AuGeNi electrode 306 is formed on the lower surface of the n-type GaP substrate 300. A light extraction window 308 is formed in the n-type electrode 306. A p-type AuZn electrode 307 is formed on the p-type contact layer 305 whose surface is etched into a recessed shape.

In this case, $xa+ya<=1$, $0<=xa$, $ya<=1$, and $a=1$ to $5$.

Light emitted by the active layer 303 travels straight in a direction indicated by an arrow A, and is extracted outside the element via the light extraction window 308 on the n-type electrode 306 side. Light indicated by an arrow B is reflected by the p-type electrode 307 formed on the recessed surface of the contact layer 305, and extracted outside from the side surface.

In the element shown in FIG. 27, light reflected by the p-type electrode 1107 is further reflected by the n-type electrode 1100, absorbed by the internal impurity of the crystal, converted into heat,and thus cannot be extracted outside. This embodiment, however, can effectively extract such light outside the element to increase the light extraction efficiency.

The compositions of the cladding layers 302 and 304 and contact layer 305 are adjusted to be larger than the band gap of the active layer 303. This can realize a structure free from any internal absorption.

By changing the composition of the active layer 303, light ranging from red to green can be emitted.

If the active layer 303 is formed into a single or multiple quantum well structure using a quantum well layer several ten Å thick, high emission efficiency and long service life can be attained.

(10) The 10th Embodiment

The 10th embodiment of the present invention will be described with reference to FIG. 14. This embodiment uses ZnSe for a semiconductor substrate.

An n-type $In(x1)Ga(y1)Al(1-x1-y1)P$ buffer layer 401 which is lattice-matched with a substrate 400, n-type $In(x2)Ga(y2)Al(1-x2-y2)P$ cladding layer 402, $In(x3)Ga(y3)Al(1-x3-y3)P$ active layer 403, p-type $In(x4)Ga(y4)Al(1-x4-y4)P$ cladding layer 404, and p-type $In(x5)Ga(y5)Al(1-x5-y5)P$ contact layer 405 are sequentially formed on the upper surface of the n-type ZnSe substrate 400.

An n-type AuGeNi electrode 406 is formed on the lower surface of the n-type ZnSe substrate 400, whereas a p-type AuZn electrode 407 is formed on the partially etched p-type contact layer 405.

The compositions x1 to x5 and y1 to y5 of the respective layers 401 to 405 must be adjusted within a range in which these layers 401 to 405 can be lattice-matched with the n-type ZnSe substrate 400. The band gaps of the p- and n-type cladding layers 404 and 402 are set larger than that of the active layer 403 to enhance the double-hetero effect.

In this structure, similar to the ninth embodiment, the surface of the p-type contact layer 405 is etched into a recessed shape. Light emitted by the active layer 403 can be reflected below the p-type electrode 407 and extracted from the end face, so that the extraction efficiency increases.

As for the element size, a general element has a size of 300 μm×300 μm. In the 10th embodiment, the element has a size of 100 μm×100 μm, which can reduce light absorption inside the element to increase the light extraction efficiency. More specifically, a light output from the entire element is substantially doubled.

By changing the compositions x3 and y3 of the active layer 403, light ranging from red to green can be emitted. If the active layer 403 is formed into a quantum well structure about several ten Å in element thickness, the stress by the ZnSe substrate can be reduced to achieve long service life.

(11) The 11th Embodiment

FIG. 15 shows a structure according to the 11th embodiment according to the present invention.

An n-type $In(x1)Ga(y1)Al(1-x1-y1)P$ buffer layer 501, n-type $In(x2)Ga(y2)Al(1-x2-y2)P$ cladding layer 502, $In(x3)Ga(y3)Al(1-x3-y3)P$ active layer 503, p-type $In(x4)Ga(y4)Al(1-x4-y4)P$ cladding layer 504, and p-type $In(x5)Ga(y5)Al(1-x5-y5)P$ contact layer 505 are sequentially formed on the upper surface of an n-type GaP semiconductor substrate 500.

An n-type AuGeNi electrode 506 is formed on the lower surface of the n-type GaP substrate 500, whereas a p-type AuZn electrode 507 is formed on the p-type contact layer 505.

In this case, $xa+ya<1$, $0<=xa$, $ya<=1$, and $a=1$ to 5.

As the element shape, the element is processed into an octagonal prism whose surface is octagonal, as shown in FIG. 15. Light, which is radiated to the four corners of a general element having a quadrangular prism shape whose surface is quadrangular, can be extracted outside without being completely reflected because the four corners of the element are cut.

The element shape is not limited to the octagonal shape, and may be a polygonal shape having five or more corners. As the number of corners increases, the light extraction efficiency increases. If the element shape is a circular cylinder whose surface is circular, the light extraction efficiency further increases.

The compositions of the cladding layers 502 and 504 and contact layer 505 are adjusted to be larger than the band gap of the active layer 503, which can realize a structure free from any internal absorption. By changing the composition of the active layer 503, light ranging from red to green can be emitted.

If the active layer 503 is formed into a single or multiple quantum well structure using a quantum well layer several ten Å thick, high emission efficiency and long service life can be attained.

(12) The 12th Embodiment

FIG. 16 shows the 12th embodiment of the present invention.

An n-type $In(x1)Ga(y1)Al(1-x1-y1)N$ buffer layer 601, n-type $In(x2)Ga(y2)Al(1-x2-y2)N$ cladding layer 602, $In(x3)Ga(y3)Al(1-x3-y3)N$ active layer 603, p-type $In(x4)Ga(y4)Al(1-x4-y4)N$ cladding layer 604, and p-type $In(x5)Ga(y5)Al(1-x5-y5)N$ contact layer 605 are sequentially formed on the upper surface of an n-type GaN substrate 600.

An n-type TiAu electrode 606 is formed on the lower surface of the n-type GaN substrate 600, while a p-type NiAu electrode 607 is formed on the p-type contact layer 605.

In this case, $xa+ya<=1$, $0<=xa$, $ya<=1$, and $a=1$ to 5.

As shown in FIG. 15, the element is processed into an octagonal prism whose surface is octagonal, thereby increasing the light extraction efficiency. The element shape is not limited to the octagonal shape, and may be a polygonal shape having five or more corners. If the element is processed into a circular cylinder, as shown in FIG. 16, the light extraction efficiency further increases.

The compositions of the cladding layers 602 and 604 and contact layer 605 are adjusted to be larger than the band gap of the active layer 603. This realizes a structure free from any internal absorption.

By changing the composition of the active layer 603, light ranging from red to green can be emitted.

If the active layer 603 is formed into a single or multiple quantum well structure using a quantum well layer several ten Å thick, high emission efficiency and long service life can be attained.

(13) The 13th Embodiment

In recent years, so-called photonics crystals are being available. The "photonics crystal" is attained by imparting a periodic gradient index to a medium. The effects of the photonics crystal become stronger for two and three dimensions, and exhibit characteristic optical properties.

The feature of the photonics crystal is based on the band gap. Since the band gap does not permit any optical state, light having a photon energy corresponding to the band gap cannot exist in the crystal. Thus, external light incident on the crystal is reflected. If a defect is linearly introduced into the crystal, photons are permitted to exist in the crystal. This realizes the light confinement effect and waveguide.

An example of the photonics crystal is one using a wafer bonding technique that is described in the following reference by Noda et al.:

"the Journal of the Institute of Electronics, Information and Communication Engineers, March 1999, pp. 232–241"

Figure 28A:
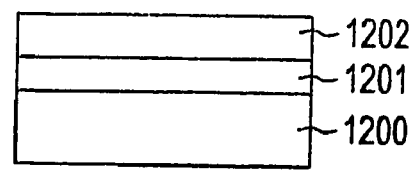
FIG. 28 is a longitudinal sectional view showing the procedure of the method for manufacturing a photonics crystal using GaAs.

FIGS. 28A to 28E show the steps of the manufacturing method. As shown in FIG. 28A, an AlGaAs layer 1201 and GaAs layer 1202 are formed on a GaAs substrate 1200.

Figure 28B:
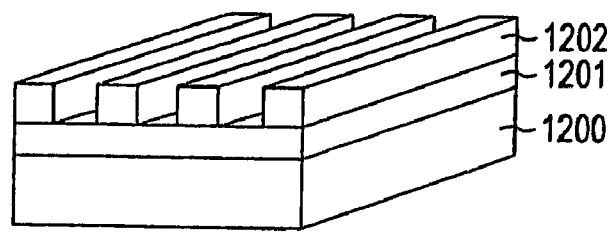

As shown in FIG. 28B, the GaAs layer 1202 is patterned into a grating shape.

Figure 28C:
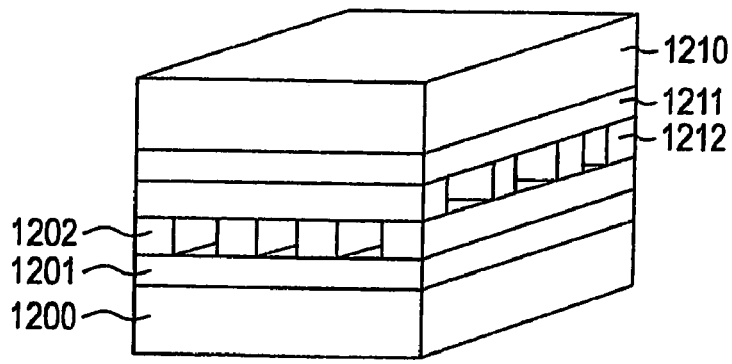

The substrate processed in this manner, and another substrate made up of a GaAs substrate 1210, AlGaAs layer 1211, and GaAs layer 1212 are prepared, and fused while being positioned to make the stripe-shaped GaAs layers 1202 and 1212 be perpendicular to each other, as shown in FIG. 28C.

Figure 28D:
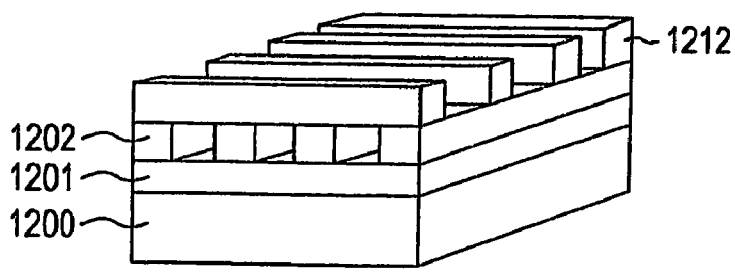
Figure 28E:
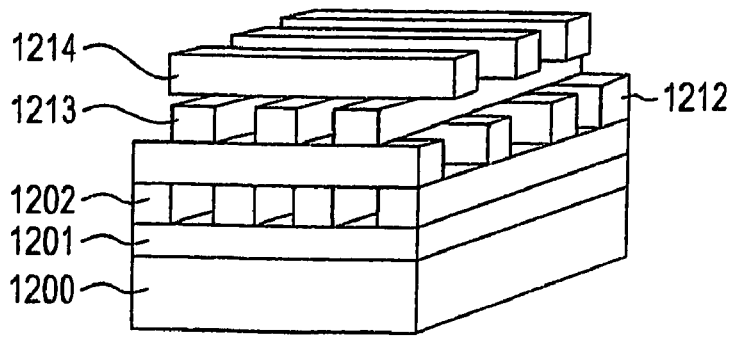

As shown in FIG. 28D, one substrate 1210 and one AlGaAs layer 1211 are selectively etched with an etchant.

By repeating the steps in FIGS. 28A to 28D, a photonics crystal with diffraction gratings made up of the GaAs-based semiconductor material and the air is manufactured. In this case, every second diffraction gratings parallel to each other must be shifted in phase by half the period of emitted light.

The 13th embodiment of the present invention using this photonics crystal will be explained with reference to FIGS. 17A and 17B.

As shown in FIG. 17A, a p-type GaAs buffer layer 701, p-type GaAs contact layer 712, p-type InGaAlP cladding layer 702, InGaAlP active layer 703, and n-type InGaAlP cladding layer 704 are sequentially grown on a p-type GaAs substrate 700 by MOCVD.

Separately from this structure, a photonics crystal layer 705 is prepared through the above-described steps, and fused onto the n-type InGaAlP cladding layer 704. An n-type GaAs n-type GaAs layer 706 is formed on the photonics crystal layer 705.

The p-type GaAs substrate 700 and p-type GaAs buffer layer 701 are removed. As shown in FIG. 17B, an n-type electrode 708 is formed on the n-type GaAs layer 706, and a p-type transparent electrode 709 is formed on the p-type GaAs contact layer 712. The p-type transparent electrode 709 is partially removed to form a blocking layer 711. A p-type electrode pad 710 is formed from the p-type transparent electrode 709 to the blocking layer 711.

In this structure, light emitted by widening a current flowing from the p-type electrode pad 710 by the p-type transparent electrode 709 and injecting it into the active layer 703 is reflected by the photonics crystal layer 705, and extracted via the p-type transparent electrode 709.

The photonics crystal layer 705 reflects 90% or more of light. As a result, a light output of 8 mW with an emission wavelength of 630 nm can be obtained for a current value of 20 mA. This value is about double the value of the element shown in FIG. 27, and the light extraction efficiency greatly increases.

(14) The 14th Embodiment

Figure 18:
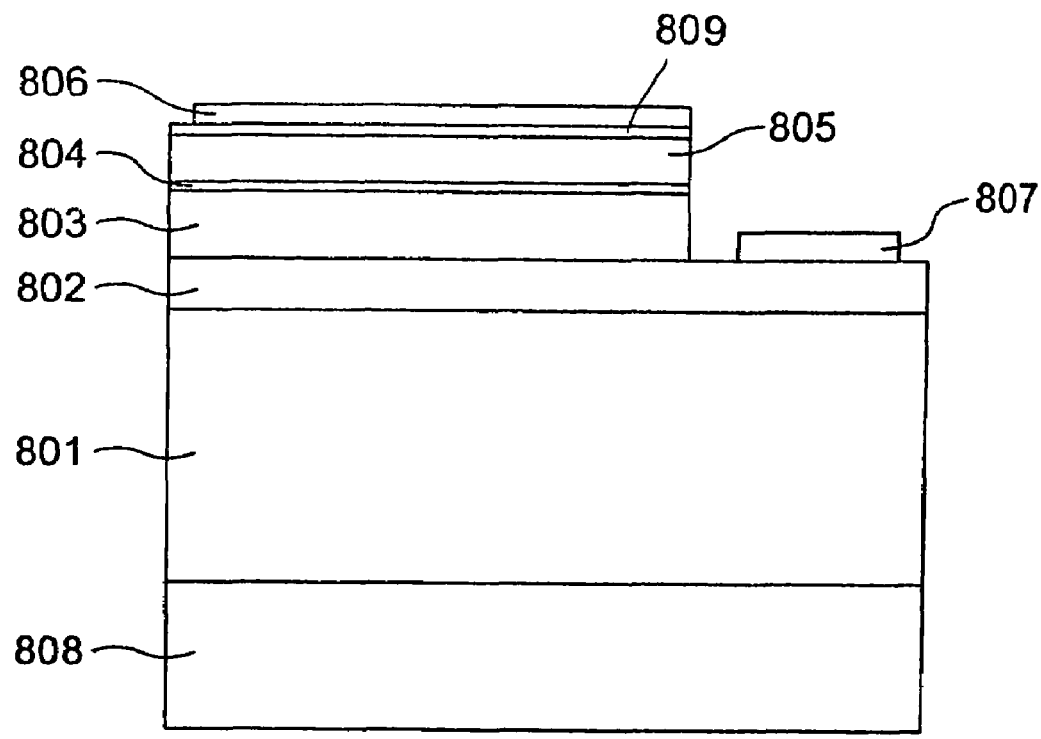
FIG. 18 is a longitudinal sectional view showing the structure of a semiconductor light-emitting element according to the fourteenth embodiment of the present invention.

The structure of an element according to the 14th embodiment of the present invention will be described with reference to FIG. 18.

The 14th embodiment concerns a GaN-based compound semiconductor light-emitting element in which a photonics crystal having a through dislocation is formed on the light extraction surface.

A GaN buffer layer (not shown), n-type GaN layer 802, n-type AlGaN cladding layer 803, InGaN active layer 804, p-type AlGaN cladding layer 805, and p-type GaN contact layer 809 are sequentially grown on a sapphire substrate 801.

The p-type AlGaN cladding layer 805, InGaN active layer 804, and n-type AlGaN cladding layer 803 are partially etched to expose the surface of the n-type GaN layer 802. A p-side electrode & bonding electrode 806 (which need not be transparent) is formed on the p-type GaN contact layer 809, and an n-side electrode 807 is formed on the n-type GaN layer 802.

Separately from this structure, e.g., a GaN photonics crystal layer is formed on a sapphire substrate. GaN on the sapphire substrate contains many through dislocations. Such a photonics crystal layer 808 and the sapphire substrate 801 are fused. In this case, the sapphire substrate 801 is transparent and does not absorb emitted light.

In this structure, a current flowing from the p-side electrode 806 is injected from the p-type GaN contact layer 809 to the InGaN active layer 804 to emit light. The light is extracted outside the element via the photonics crystal layer 808.

As described above, the photonics crystal layer 808 contains many through dislocations. Thus, the photonics crystal layer 808 does not reflect light, unlike the n-type GaAs layer 706 in the 13th embodiment, and light travels along the through dislocations and is efficiently extracted outside the chip. This photonics crystal layer 808 also functions as a filter to obtain monochrome light with a smaller half-width wavelength.

(15) The 15th Embodiment

Figure 19:
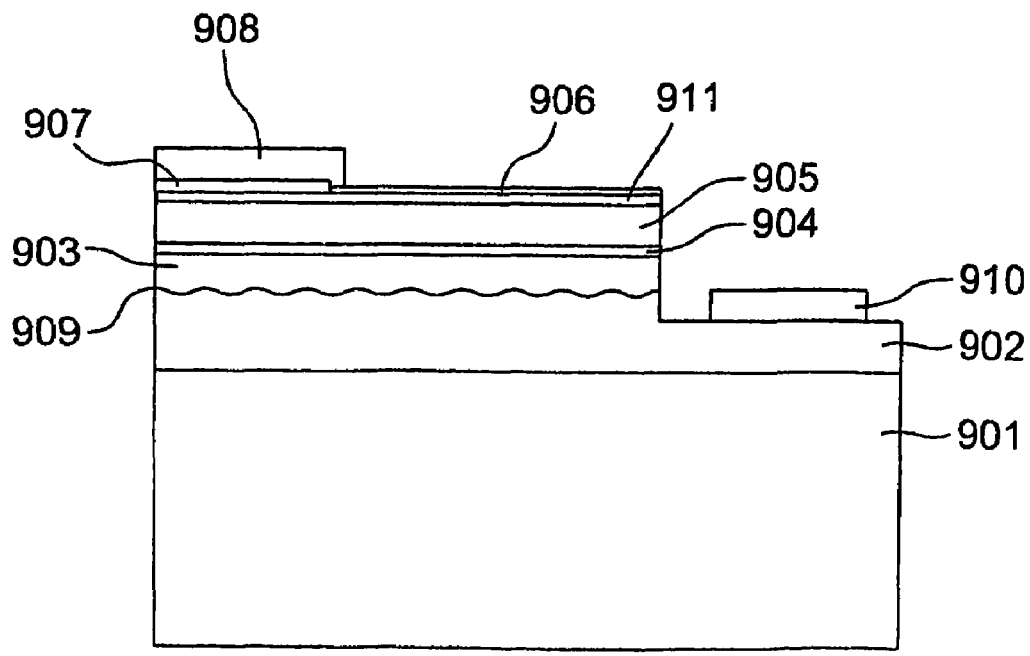
FIG. 19 is a longitudinal sectional view showing the structure of a semiconductor light-emitting element according to the fifteenth embodiment of the present invention.

The 15th embodiment will be described with reference to FIG. 19. This embodiment concerns an example in which no photonics crystal is introduced.

The 15th embodiment is about a GaN-based compound semiconductor light-emitting element. A GaN buffer layer (not shown), n-type GaN layer 902, n-type AlGaN cladding layer 903, InGaN active layer 904, p-type AlGaN cladding layer 905, and p-type GaN contact layer 911 are sequentially grown on an n-type GaN substrate 901. The p-type GaN contact layer 911, p-type AlGaN cladding layer 905, InGaN active layer 904, n-type AlGaN cladding layer 903, and n-type GaN layer 902 are partially etched to expose the surface of the n-type GaN layer 902.

A p-side transparent electrode 906 is formed on the p-type AlGaN cladding layer 905. A current blocking layer 907 made of a current blocking insulating film is formed adjacent to the p-side transparent electrode 906. A p-side bonding electrode 908 connected to the p-side transparent electrode 906 is formed on the current blocking layer 907. Further, an n-side electrode 910 is formed on the n-type GaN contact layer 902.

After the interface of the n-type GaN layer 902 is corrugated, the n-type AlGaN cladding layer 903 is grown to have the gradient index. As a method of corrugating the interface of the n-type GaN layer 902, the method shown in FIGS. 20A to 20D or FIGS. 21A to 21C may be employed.

Figure 20A:
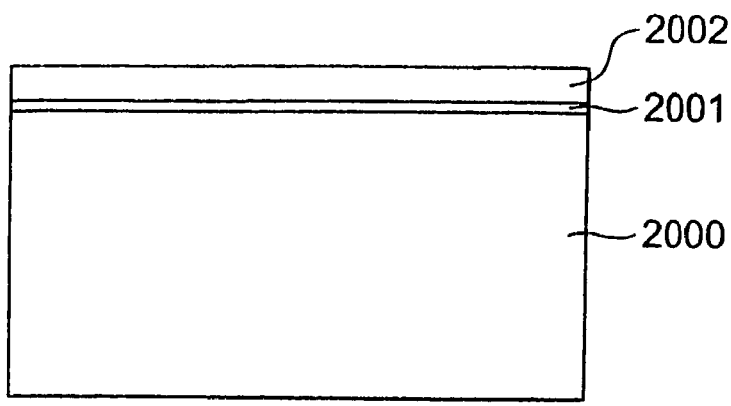
FIG. 20 is a longitudinal sectional view showing the method for forming a roughness on the surface of the GaN layer of the semiconductor light-emitting element according to the fifteenth embodiment of the present invention.

According to the method shown in FIGS. 20A to 20D, a GaN buffer layer 2001 and n-type GaN contact layer 2002 are sequentially formed on a sapphire substrate 2000, as shown in FIG. 20A.

Figure 20B:
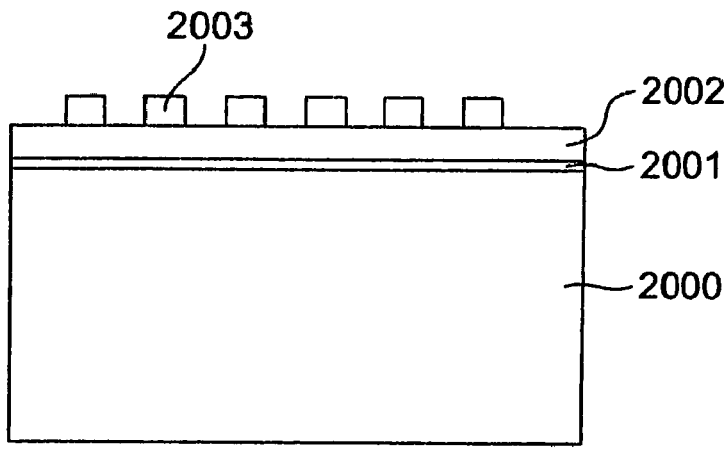

As shown in FIG. 20B, a resist is applied and patterned by photolithography to form a resist film 2003.

Figure 20C:
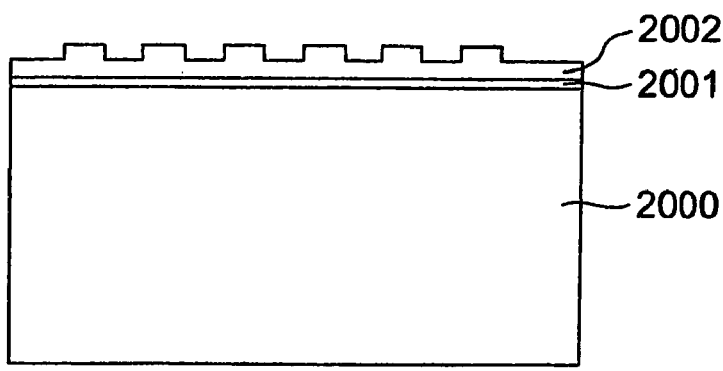

As shown in FIG. 20C, the surface of the n-type GaN contact layer 2002 is corrugated using the resist film 2003 as a mask.

Figure 20D:
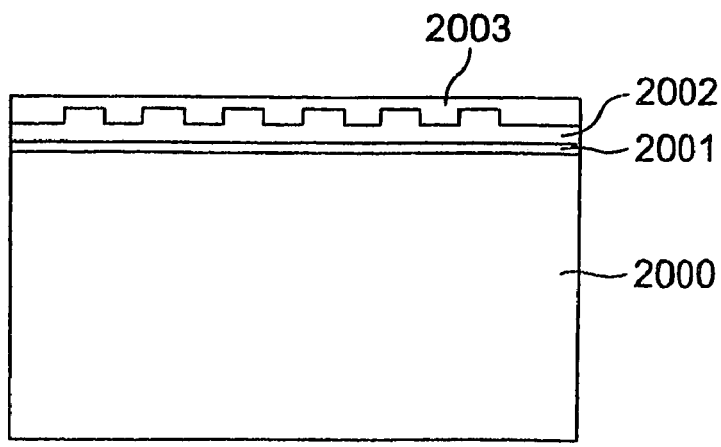

As shown in FIG. 20D, a p-type AlGaN cladding layer 2003 is formed to planarize the surface.

Alternatively, according to the method shown in FIGS. 21A to 21C, a GaN buffer layer 2101 and n-type GaN contact layer 2102 are sequentially formed on a sapphire substrate 2100, as shown in FIG. 21A.

As shown in FIG. 21B, the ratio of $Cl_2$ gas is set high by setting the ratio of an etching gas flow rate in reactive ion etching to $BC_{13}:Cl_2=1:1$. Then, the surface of the n-type GaN contact layer 2102 becomes rough.

As shown in FIG. 21C, a p-type AlGaN cladding layer 2103 is formed to planarize the surface.

According to the 15th embodiment, the interface of the n-type GaN layer 902 is corrugated to have the gradient index with the n-type AlGaN cladding layer 903. Light is reflected and scattered by the interface, and a larger amount of light is extracted outside the element.

(16) The 16th Embodiment

Figure 22A:
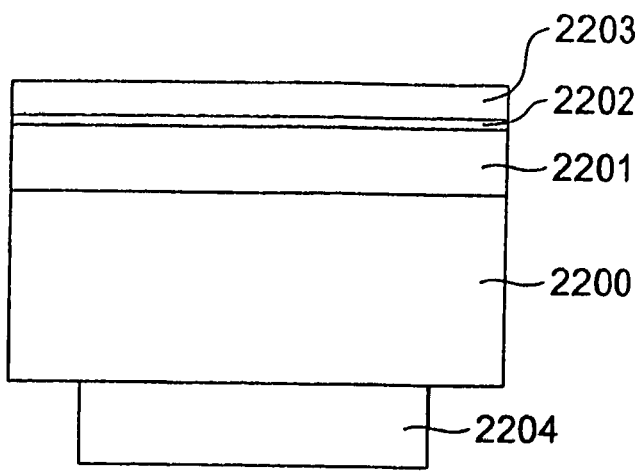
FIG. 22 is a longitudinal sectional view showing the structure of a semiconductor light-emitting element according to the sixteenth embodiment of the present invention.

An element according to the 16th embodiment will be explained with reference to FIGS. 22A to 22D. As shown in FIG. 22A, a buffer layer (not shown), cladding layer 2201, active layer 2202, and cladding layer 2203 are sequentially formed on a substrate 2200. A resist film 2204 is formed on a surface of the substrate 2200 opposite to the element formation surface.

Figure 22B:
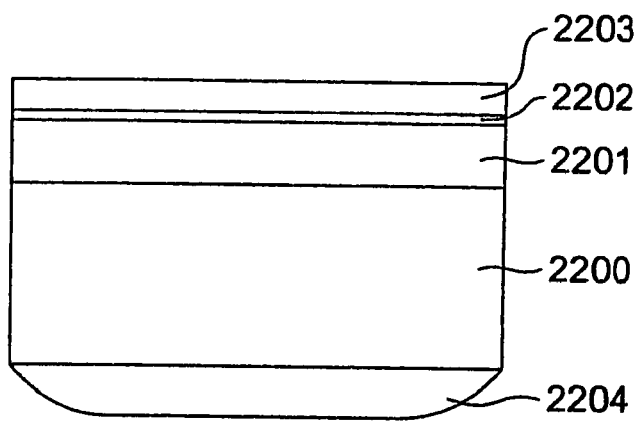

As shown in FIG. 22B, the resist film 2204 is heated to round its edge.

Figure 22C:
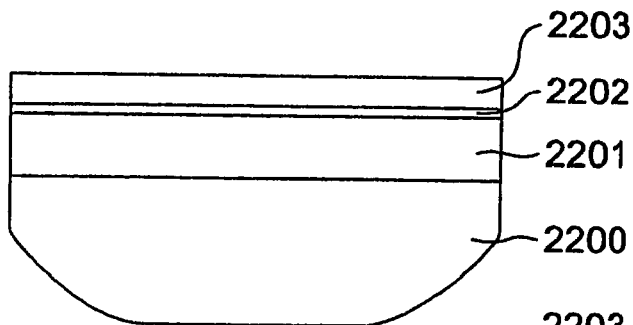

As shown in FIG. 22C, the structure is etched using the resist film 2204 as a mask to process the edge of the semiconductor substrate 2200 into a shape corresponding to the rounded shape of the resist film 2204.

Figure 22D:
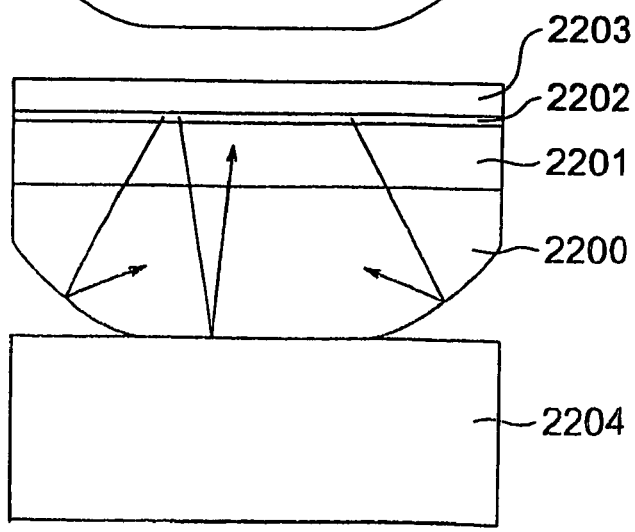

As shown in FIG. 22D, a photonics crystal layer 2204 having a high reflectivity is fused to the substrate 2200.

According to the 16th embodiment, as indicated by arrows in FIG. 22D, light emitted by the active layer 2202 is reflected by the etched portions of the substrate 2200 at various angles. Accordingly, the light extraction efficiency and emission intensity increase.

(17) The 17th Embodiment

A light-emitting element which emits light with three wavelengths can be implemented by forming, on a photonics crystal layer, three light-emitting elements having different emission wavelengths like a light-emitting element formed on a sapphire substrate.

Figure 23:
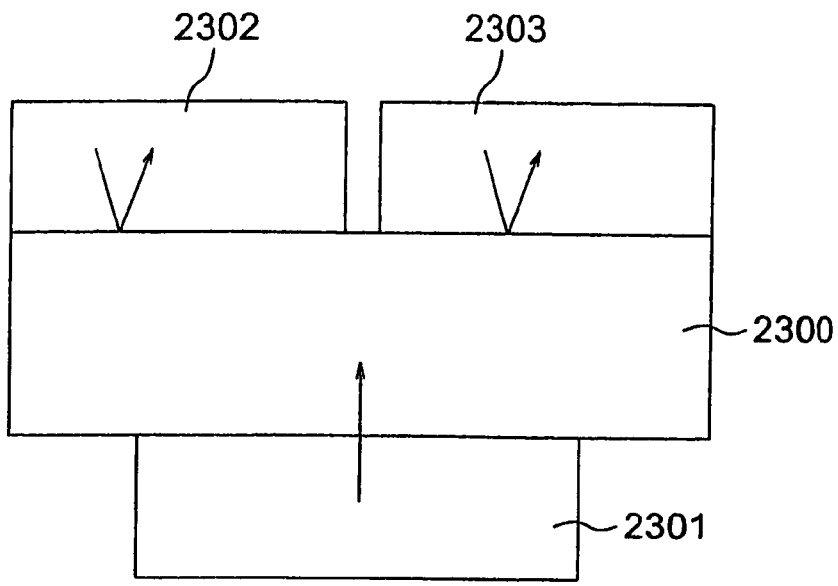
FIG. 23 is a longitudinal sectional view showing the structure of a semiconductor light-emitting element according to the seventeenth embodiment of the present invention.

As shown in FIG. 23, blue- and green-emitting elements 2302 and 2303 are formed on one surface of a photonics crystal layer 2300, while a red-emitting element 2301 is formed on the other surface.

The photonics crystal layer 2300 having a high reflectivity with respect to light in the short-wave range is formed to prevent short-wavelength beams from the blue- and green-emitting elements 2302 and 2303 from passing through the photonics crystal layer 2300 and optically exciting the active layer of the red-emitting element 2301. The red-emitting element 2301 for emitting a long-wavelength beam is fused to the lower surface of the photonics crystal layer 2300. With this structure, blue, green, and red beams are mixed to obtain a white beam.

In this case, the colors of light-emitting elements can be variously combined, and the mixed color is changed in accordance with the combination.

(18) The 18th Embodiment

Figure 24:
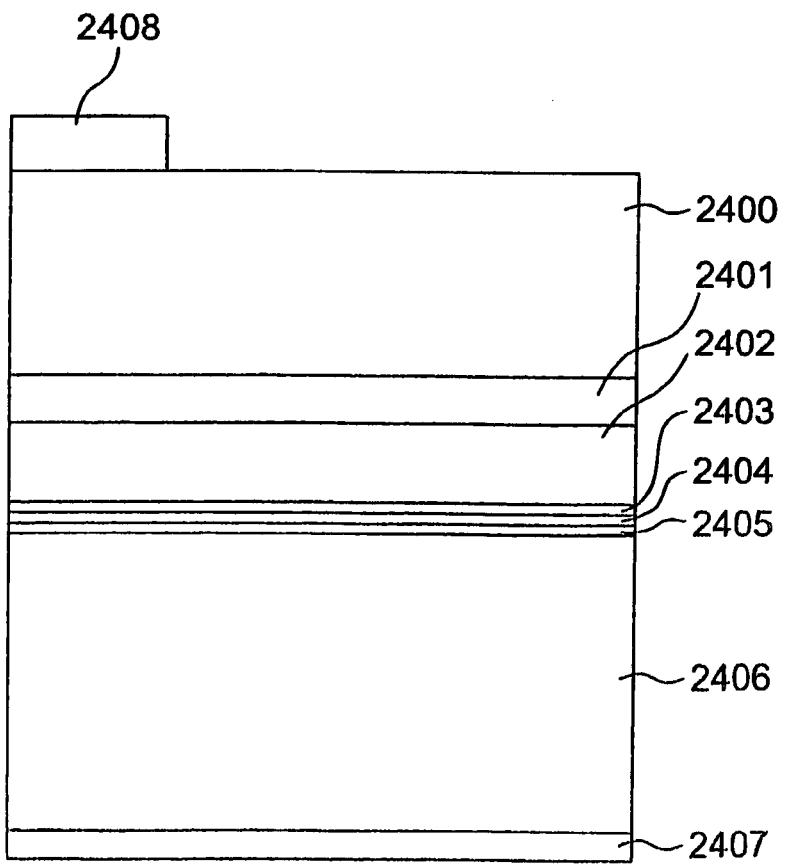
FIG. 24 is a longitudinal sectional view showing the structure of a semiconductor light-emitting element according to the eighteenth embodiment of the present invention.

The 18th embodiment of the present invention will be described with reference to FIG. 24. This embodiment exemplifies a GaN-based RC-LED (Resonance Cavity LED). An n-type GaN buffer layer 2401, and AlGaN/GaN DBR (Distributed Bragg Reflector) layer 2402 having a medium reflectivity are formed on a transparent GaN-based semiconductor substrate 2400. Further, an InGaN active layer 2403 having a MQW (Multiple Quantum Well) structure, p-type AlGaN cladding layer 2404, and p-type InGaN bonding layer 2405 are formed on the DBR layer 2402.

A photonics crystal layer 2406 with a high reflectivity that is prepared separately is bonded to the cladding layer 2404 via the bonding layer 2405. Then, a p-type electrode 2407 is formed on the lower surface of the photonics crystal layer 2406, and an n-type electrode 2408 is formed on the upper surface of the semiconductor substrate 2400.

The DBR layer having a high reflectivity is difficult to obtain using a GaN-based semiconductor material. By introducing the photonics crystal layer 2406, high light extraction efficiency can be realized.

The materials of the respective layers are not limited to the above ones, and another GaN-based semiconductor material or a GaAs-based semiconductor material may be adopted. If a GaAs-based material is adopted, GaAs absorbs emitted light. To prevent this, the substrate is removed to fuse the light-emitting layer to a GaP substrate or the like.

The element according to the 18th embodiment can also be applied to a VCSEL (Vertical Cavity Surface Emitting Laser).

A method of forming a GaN-based photonics crystal will be described with reference to FIGS. 25A to 25E.

Figure 25A:
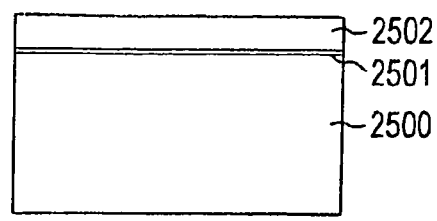
FIG. 25 is a longitudinal sectional view showing the procedure of the method for manufacturing a photonics crystal using GaN.

As shown in FIG. 25A, a buffer layer 2501 and $In(x)Al(y)Ga(1-x-y)N$ layer ($0 \leq x, y \leq 1$) 2502 are formed on a GaN substrate 2500.

Figure 25B:
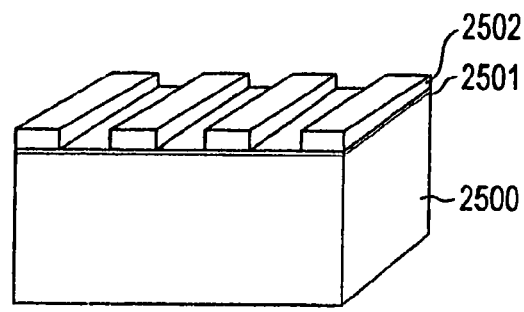

As shown in FIG. 25B, the $In(x)Al(y)Ga(1-x-y)N$ layer 2502 is patterned into a grating shape.

Figure 25C:
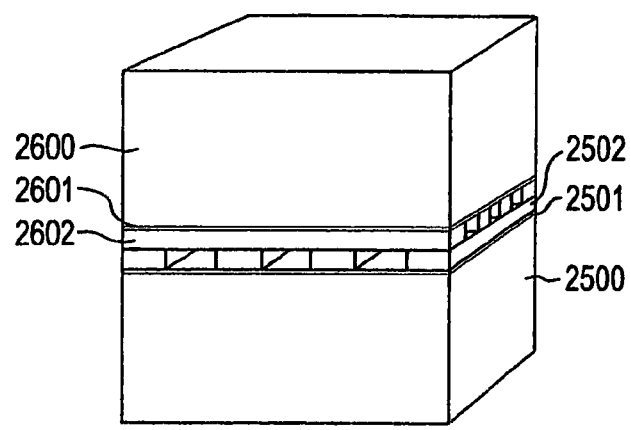

The substrate processed in this manner, and another substrate made up of a GaN substrate 2600, buffer layer 2601, and $In(x)Al(y)Ga(1-x-y)N$ layer 2602 are prepared, and fused while being positioned to make the stripe-shaped layers 2502 and 2602 be perpendicular to each other, as shown in FIG. 25C.

Figure 25D:
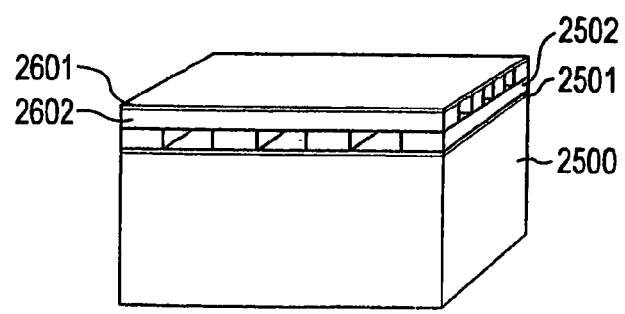

As shown in FIG. 25D, one GaN substrate 2600 is removed by irradiating it with a laser beam.

Figure 25E:
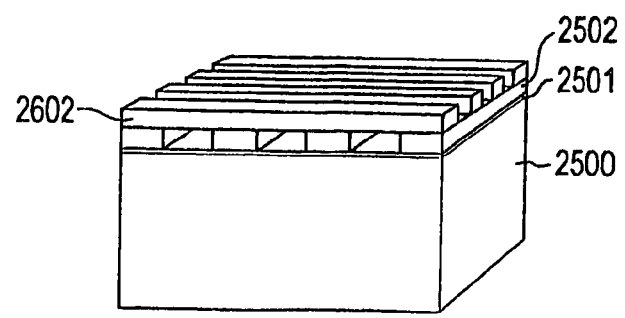

As shown in FIG. 25E, the buffer layer 2601 is removed by reactive ion etching.

By repeating the steps in FIGS. 25A to 25E, a photonics crystal having diffraction gratings is manufactured. In this case, every second diffraction gratings parallel to each other must be shifted in phase by half the period of emitted light.

According to the 13th to 18th embodiments, a photonics crystal region or a region having a predetermined gradient index is formed on at least one surface of the light-emitting layer of a compound semiconductor light-emitting element.

In particularly, the photonics crystal does not permit light corresponding to the band gap to exist, and thus functions as a high-reflectivity film. The photonics crystal exhibits a high reflectivity with respect to a light component other than a vertically incident light component. By introducing this photonics crystal as a reflective layer, the light extraction efficiency can be increased.

In a GaN-based compound semiconductor light-emitting element, many through dislocations exist in a GaN layer. When a photonics crystal is formed using this crystal, the photonics crystal fused to the substrate contains many through dislocations. Hence, light travels along the dislocations and is efficiently extracted outside the element. The photonics crystal in this case functions as a filter, so that monochrome light with a smaller half-width wavelength can be obtained.

If a light-emitting element having a different emission wavelength from that of a light-emitting element formed on a sapphire substrate is formed on a photonics crystal layer, a light-emitting element for emitting light with two wavelengths can be implemented.

Alternatively, the interface of a semiconductor layer is corrugated to obtain the gradient index inside the semiconductor layer. Light is reflected and scattered by this interface, and can be more effectively extracted outside the element.

The gradient index may be obtained inside the semiconductor layer by a combination of semiconductor layers having different refractive indices.

In a gradient index region, light emitted by an active layer is reflected by a larger amount in a chip, and extracted from the light extraction surface. This can greatly increase the light extraction efficiency and luminance.

The increase in luminance can decrease the injection current and can also improve the element reliability.

What is claimed is:

1. A semiconductor light-emitting element manufacturing method comprising the steps of:
   sequentially forming a buffer layer, a first cladding layer, a light-emitting layer, and a second cladding layer on a first semiconductor substrate;
   forming a photonics crystal layer on a second semiconductor substrate;
   fusing the second cladding layer and the photonics crystal layer; and
   removing the first semiconductor substrate and the buffer layer.

2. A semiconductor light-emitting element manufacturing method comprising the steps of:
   sequentially forming a buffer layer, a contact layer, a first cladding layer, a light-emitting layer, and a second cladding layer on a first transparent semiconductor substrate;
   forming a photonics crystal layer on a second semiconductor substrate;
   fusing the first semiconductor substrate and the photonics crystal layer; and
   removing the second semiconductor substrate,
   when the photonics crystal layer contains a through dislocation on a light extraction surface in a substantially vertical direction to pass light emitted by the light-emitting layer.

3. A semiconductor light-emitting element manufacturing method comprising the steps of:
   forming a contact layer on a semiconductor substrate;
   corrugating a surface of the contact layer; and
   sequentially forming a first cladding layer, a light-emitting layer, and a second cladding layer on the contact layer,
   wherein a gradient index is given by the corrugated interface of the contact layer in contact with a first cladding layer, and light emitted by the light-emitting layer is reflected by the interface.

4. A semiconductor light-emitting element manufacturing method comprising the steps of:
   forming a buffer layer on a first transparent semiconductor substrate;
   forming a Bragg reflective layer on the buffer layer;
   sequentially forming a light-emitting layer, a cladding layer, and a bonding layer on the Bragg reflective layer;
   forming a photonics crystal layer on a second semiconductor substrate;
   bonding the cladding layer and photonics crystal layer via the bonding layer; and
   removing the second semiconductor substrate.

* * * * *